(12) United States Patent
Huang

(10) Patent No.: US 11,227,926 B2
(45) Date of Patent: Jan. 18, 2022

(54) SEMICONDUCTOR DEVICE AND METHOD FOR FABRICATING THE SAME

(71) Applicant: NANYA TECHNOLOGY CORPORATION, New Taipei (TW)

(72) Inventor: Ching-Chia Huang, Taipei (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/889,127

(22) Filed: Jun. 1, 2020

(65) Prior Publication Data

US 2021/0376098 A1 Dec. 2, 2021

(51) Int. Cl.
| | |
|---|---|
| *H01L 29/423* | (2006.01) |
| *H01L 27/108* | (2006.01) |
| *H01L 29/66* | (2006.01) |
| *H01L 29/08* | (2006.01) |
| *H01L 29/78* | (2006.01) |
| H01L 21/266 | (2006.01) |

(52) U.S. Cl.
CPC .... *H01L 29/4236* (2013.01); *H01L 27/10823* (2013.01); *H01L 29/0847* (2013.01); *H01L 29/66621* (2013.01); *H01L 29/7831* (2013.01); H01L 21/266 (2013.01)

(58) Field of Classification Search
CPC .......... H01L 29/0847; H01L 29/42336; H01L 29/42352; H01L 29/4236; H01L 29/66621; H01L 29/66074; H01L 29/66734; H01L 29/7813; H01L 29/7825; H01L 27/10823; H01L 27/10876; H01L 21/0415; H01L 21/046; H01L 21/2253; H01L 21/265–266; H01L 21/425–426; H01L 21/76859; H01L 29/1058; H01L 29/1066; H01L 29/66893; H01L 29/7392; H01L 29/808; H01L 21/04; H01L 21/098
See application file for complete search history.

(56) References Cited

U.S. PATENT DOCUMENTS

| | | | |
|---|---|---|---|
| 6,479,350 B1 * | 11/2002 | Ling | ............... H01L 21/823814 257/E21.634 |
| 6,844,591 B1 * | 1/2005 | Tran | ................... H01L 27/10876 257/330 |
| 7,651,923 B2 * | 1/2010 | Cho | ................... H01L 21/76224 438/437 |
| 8,975,140 B2 * | 3/2015 | Chung | .............. H01L 21/76224 438/270 |
| 9,356,029 B2 * | 5/2016 | Oh | ..................... H01L 21/32133 |

(Continued)

*Primary Examiner* — Maliheh Malek
(74) *Attorney, Agent, or Firm* — Muncy, Geissler, Olds & Lowe, P.C.

(57) ABSTRACT

The present disclosure provides a semiconductor device. The semiconductor device comprises a substrate, a plurality of isolation regions in the substrate and an active region surrounded by the isolation regions. A p-type doped region is interposed between two n-type doped regions in the substrate. A buried gate structure is formed in the substrate and disposed between the p-type doped region and the n-type doped region. The buried gate structure comprises a gate conductive material, a gate insulating layer disposed over the gate conductive material and a gate liner surrounding the gate conductive material and the gate insulating layer. A plurality of contact plugs are formed on the p-type doped region and the plurality of n-type doped regions.

16 Claims, 21 Drawing Sheets

(56) References Cited

U.S. PATENT DOCUMENTS

| Patent/Pub. No. | Date | Name | Classification |
|---|---|---|---|
| 10,043,811 B1* | 8/2018 | Tsai | H01L 27/10891 |
| 10,361,205 B2* | 7/2019 | Cho | H01L 27/1207 |
| 10,763,212 B1* | 9/2020 | Hsieh | H01L 23/53295 |
| 10,770,463 B2* | 9/2020 | Cho | H01L 21/7682 |
| 10,818,800 B2* | 10/2020 | Hsieh | H01L 29/42392 |
| 10,886,277 B2* | 1/2021 | Hong | H01L 23/535 |
| 10,937,886 B2* | 3/2021 | Huang | H01L 29/517 |
| 11,004,854 B2* | 5/2021 | Nam | H01L 27/10876 |
| 11,101,273 B1* | 8/2021 | Huang | H01L 27/10823 |
| 2011/0003459 A1* | 1/2011 | Shin | H01L 29/4236 438/430 |
| 2011/0260242 A1* | 10/2011 | Jang | H01L 29/4966 257/331 |
| 2012/0074518 A1* | 3/2012 | Kim | H01L 27/10891 257/506 |
| 2012/0187450 A1* | 7/2012 | Jakubowski | H01L 21/76224 257/192 |
| 2012/0217576 A1* | 8/2012 | Yeo | H01L 27/10876 257/330 |
| 2013/0052780 A1* | 2/2013 | Kim | H01L 27/10855 438/270 |
| 2013/0056823 A1* | 3/2013 | Kim | H01L 27/10894 257/334 |
| 2013/0320558 A1* | 12/2013 | Kim | H01L 27/10885 257/774 |
| 2014/0054775 A1* | 2/2014 | Kim | H01L 27/10876 257/751 |
| 2014/0312408 A1* | 10/2014 | Fang | H01L 29/40117 257/324 |
| 2015/0132945 A1* | 5/2015 | Park | H01L 21/7682 438/637 |
| 2015/0171214 A1* | 6/2015 | Han | H01L 27/10814 257/330 |
| 2015/0340453 A1* | 11/2015 | Cho | H01L 27/10885 257/330 |
| 2016/0181198 A1* | 6/2016 | Kim | H01L 27/10814 257/532 |
| 2016/0204201 A1* | 7/2016 | Oh | H01L 27/10814 257/330 |
| 2016/0284640 A1* | 9/2016 | Wang | H01L 27/0207 |
| 2016/0315088 A1* | 10/2016 | Kang | H01L 29/517 |
| 2016/0351711 A1* | 12/2016 | Bae | H01L 29/4236 |
| 2016/0365272 A1* | 12/2016 | Sato | H01L 21/31055 |
| 2016/0372359 A1* | 12/2016 | Kong | H01L 29/78 |
| 2018/0005830 A1* | 1/2018 | Laven | H01L 29/7813 |
| 2018/0315859 A1* | 11/2018 | Ramaswamy | H01L 27/11521 |
| 2019/0115444 A1* | 4/2019 | Bentley | H01L 29/516 |
| 2019/0139963 A1* | 5/2019 | Hong | H01L 27/10888 |
| 2019/0148534 A1* | 5/2019 | Zhao | H01L 29/66484 257/29 |
| 2019/0198502 A1* | 6/2019 | Huang | H01L 29/7827 |
| 2019/0198676 A1* | 6/2019 | Hsieh | H01L 29/42392 |
| 2019/0304786 A1* | 10/2019 | Ali | H01L 29/7816 |
| 2019/0348511 A1* | 11/2019 | Karpov | H01L 21/823431 |
| 2019/0393320 A1* | 12/2019 | Yoo | H01L 21/28114 |
| 2020/0006488 A1* | 1/2020 | Mehandru | H01L 29/66469 |
| 2020/0006525 A1* | 1/2020 | Crum | H01L 29/785 |
| 2020/0035560 A1* | 1/2020 | Block | H01L 24/80 |
| 2020/0058738 A1* | 2/2020 | Afzalian | H01L 29/0847 |
| 2020/0066726 A1* | 2/2020 | Fishburn | H01L 27/10876 |
| 2020/0161305 A1* | 5/2020 | Nam | H01L 27/10855 |
| 2020/0168724 A1* | 5/2020 | Huang | H01L 29/66356 |
| 2020/0185507 A1* | 6/2020 | Huang | H01L 27/11507 |
| 2020/0411691 A1* | 12/2020 | Jambunathan | H01L 29/785 |
| 2021/0126087 A1* | 4/2021 | Huang | H01L 29/4236 |
| 2021/0143149 A1* | 5/2021 | Huang | H01L 29/1033 |
| 2021/0257372 A1* | 8/2021 | Huang | H01L 23/53257 |
| 2021/0257373 A1* | 8/2021 | Kang | H01L 27/10885 |

* cited by examiner

SEMICONDUCTOR DEVICE AND METHOD FOR FABRICATING THE SAME

TECHNICAL FIELD

The present disclosure relates to a semiconductor device and a method for fabricating the semiconductor device, and more particularly, to a semiconductor device including a buried channel array transistor structure.

DISCUSSION OF THE BACKGROUND

Over the past few decades, as semiconductor fabrication technology continues to improve, sizes of electronic devices are reduced correspondingly. As the size of a transistor is reduced to about a few nanometers in length, various problems such as current leakage, short channeling effect, drain-induced barrier lowering, threshold voltage decrease and/or subthreshold swing increase may arise because of the decrease of the transistor channel length. These problems may result in a significant drop in transistor performance.

Therefore, the length of the transistor channel cannot continue to be reduced indefinitely. Thus, there is still a significant need to improve the fabrication method of transistors.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a method of fabricating a semiconductor device. The method comprises providing a substrate comprising a first surface; forming a sacrificial oxide layer on the first surface; forming a plurality of isolation regions in the substrate to define an active region; implanting first dopants into the active region to form a first doped region; implanting second dopants into the active region to form a second doped region, wherein an interface exists between the first doped region and the second doped region; forming a buried gate structure between the first doped region and the second doped region, wherein the formation of the buried gate structure comprises forming a gate trench between the first doped region and the second doped region; forming a gate liner on a sidewall of the gate trench; forming a gate conductive material within the gate trench and surrounded by the gate liner; forming a gate insulating layer on the gate conductive material; and forming a contact plug on the substrate to electrically connect the contact plug to the first doped region and the second doped region.

In some embodiments, the formation of the plurality of isolation regions comprises: forming a first patterned photoresist to define locations of the plurality of isolation regions; removing the substrate and the sacrificial oxide layer exposed through the first patterned photoresist to form a plurality of isolation trenches; and filling each of the plurality of isolation trenches with an insulating material.

In some embodiments, the implantation of the first dopants into the active region includes forming a first implant mask on the active region, the first implant mask including an opening that exposes a portion of the sacrificial oxide layer.

In some embodiments, the implantation of the second dopants into the active region includes forming a second implant mask on the active region, the second implant mask covering the first doped region.

In some embodiments, the implantation of the first dopants into the active region includes forming the first doped region with a first depth in the substrate.

In some embodiments, the implantation of the second dopants into the active region includes forming the second doped region with a second depth in the substrate.

In some embodiments, the first depth is substantially greater than the second depth.

In some embodiments, the first doped region and the second doped region are substantially separated from each other by the buried gate structure.

In some embodiments, the formation of the gate trench comprises: forming a second patterned photoresist on the substrate, wherein the second patterned photoresist exposes surfaces of the plurality of isolation regions and a surface of the sacrificial oxide layer over the interface between the first doped region and the second doped region; and removing the sacrificial oxide layer and the active region exposed through the second patterned photoresist to form the gate trench.

In some embodiments, the gate trench is located at the interface between the first doped region and the second doped region.

In some embodiments, the formation of the gate conductive material comprises depositing the gate conductive material in a lower portion of the gate trench, wherein a top surface of the gate conductive material is lower than the first surface of the substrate.

In some embodiments, the formation of the gate insulating layer comprises depositing the gate insulating layer in an upper portion of the gate trench.

In some embodiments, after the formation of the gate insulating layer, a planarization process is performed to remove at least a portion of the sacrificial oxide layer to expose the first surface of the substrate, wherein the first doped region and the second doped region are exposed through the first surface.

In some embodiments, the formation of the contact plug comprises embedding a portion of the contact plug in the second doped region.

In some embodiments, the first doped region and the second doped region are at two opposite sides of the buried gate structure.

In some embodiments, the buried gate structure extends along the first surface of the substrate.

In some embodiments, the contact plug extends along a direction substantially perpendicular to the first surface of the substrate.

Another aspect of the present disclosure provides a semiconductor device. The semiconductor device comprises a substrate. A plurality of isolation regions are in the substrate. An active region is surrounded by at least two of the plurality of isolation regions. A first doped region is interposed between two of a plurality of second doped regions in the substrate. A plurality of buried gate structures are disposed in the substrate and between the first doped region and one of the plurality of second doped regions. The buried gate structure comprises a gate conductive material, a gate insulating layer disposed over the gate conductive material and a gate liner surrounding the gate conductive material and the gate insulating layer. A plurality of contact plugs are disposed on the first doped region and the plurality of second regions.

In some embodiments, the plurality of buried gate structures are arranged along a first direction, and each of the plurality of buried gate structures extends in a second direction substantially perpendicular to the first direction.

In some embodiments, each of the plurality of contact plugs extends in a third direction substantially perpendicular to the first direction and the second direction.

The present disclosure provides a semiconductor device comprising both a BCAT structure and a tunneling field-effect transistor (TFET) structure. The BCAT structure provides a buried gate structure in the semiconductor device, creating a U-shaped buried channel between a p-type doped region and an n-type doped region in an active region of the semiconductor device. Therefore, compared with a conventional planar metal-oxide-semiconductor FET (MOSFET) having a straight channel, the effective channel length in the semiconductor device can be greatly increased. The BCAT structure may be effective to, for example, suppress a short channel effect in the semiconductor device. In addition, with the quantum band-to-band tunneling (BTBT) mechanism in the TFET structure, the semiconductor device operates in a mechanism different from that of a thermionic emission occurring in a conventional MOSFET. As a result, the occurrence of leakage current in the semiconductor device can be reduced so as to reduce the subthreshold swing. The performance of the semiconductor device can be greatly improved with inclusion of the BCAT and the TFET.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
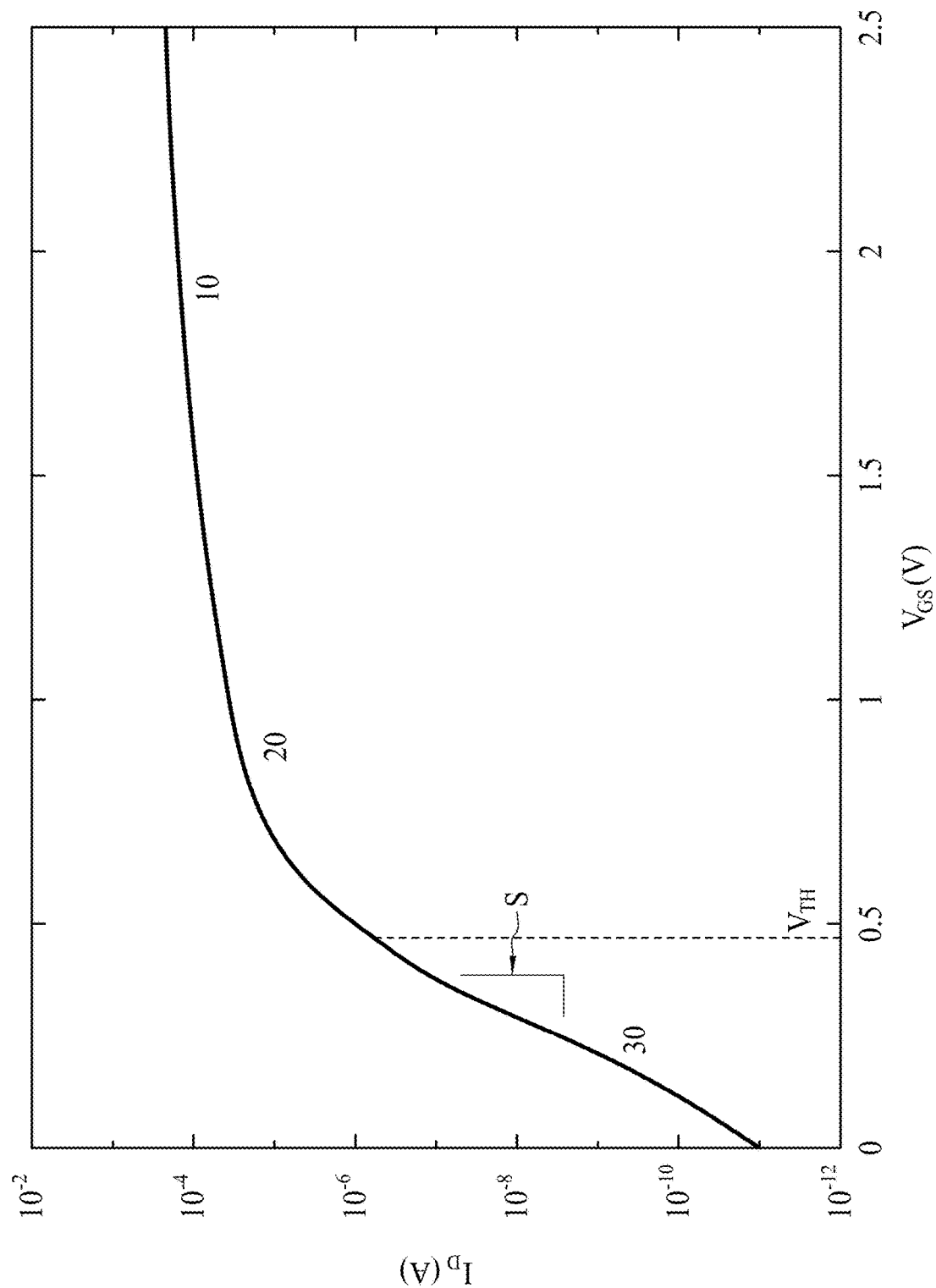
FIG. 1 is a current-voltage (I-V) characteristic curve of MOSFETs, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the terms "patterning" and "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etching or other removal process. The mask can be a photoresist, or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

As used herein, the terms "n-type doping" and "n-type doped" are used to describe adding electron-increasing dopants/impurities including, for example but not limited to, group VA atoms (dopants) into a material matrix in order to manipulate the carrier numbers. As used herein, the terms "p-type doping" and "p-type doped" are used to describe adding hole-increasing dopants/impurities including, for example but not limited to, group IIIA atoms (dopants) into a material matrix in order to manipulate the carrier numbers.

A MOSFET is a semiconductor device which is widely used for switching and amplifying electronic signals in most integrated circuits (ICs). The MOSFET is a device with terminals of source (S), gate (G) and drain (D). A channel is located between the source and the drain, wherein charge carriers (electrons or holes) flow in the channel Source is the terminal through which charge carriers enter the channel Drain is the terminal through which charge carriers leave the channel Gate is the terminal that modulates the channel conductivity to turn the channel on or off. The gate terminal is separated from the channel by an extremely thin oxide layer called gate oxide.

The MOSFET works by electronically varying the width of the channel along which charge carriers flow. The width of the channel is controlled by a gate-to-source voltage ($V_{GS}$), which is sometimes abbreviated as a gate voltage ($V_G$) applied to the gate terminal of the transistor. Controlling the gate voltage is equivalent to controlling the electric field in the gate oxide, which can control the conduction characteristics between the source terminal and the drain terminal.

A threshold voltage ($V_{TH}$) of a MOSFET is the minimum gate-to-source voltage that is needed to create a conducting channel between the source terminal and the drain terminal. For example, in an NMOS, when a greater gate-to-source voltage than the threshold voltage is applied ($V_{GS}>V_{TH}$), the more positive gate attracts electrons at the oxide-silicon interface, inducing a low-resistance channel in the substrate below the oxide. At such time, charges can flow in the channel between the source and the drain. Therefore, the transistor is turned on. On the other hand, when the gate-to-source voltage is less than the threshold voltage ($V_{GS}<V_{TH}$), ideally there is no current from the drain to the source. Therefore, the transistor is turned off and the drain current ($I_D$) should be zero. However, there is a subthreshold drain current when the gate-to-source voltage is less than the threshold voltage. Because the energy of charge carriers follows the Maxwell-Boltzmann distribution, there are electrons having different energies. As the transistor size minimizes, the channel length of the transistor also decreases, causing the energy barrier of the channel to decrease. At such time, electrons with greater energy can flow or diffuse to the drain under real conditions, although the channel of the transistor is turned off. Therefore, the actual drain current is not zero when the gate-to-source voltage is less than the threshold voltage. The non-zero drain current is a so-called subthreshold current, which is an exponential function of gate-to-source voltage. The subthreshold current is also called a weak-inversion current or a subthreshold leakage. Due to the existence of the subthreshold current, the MOSFET device is not truly turned off. In some integrated circuit (IC) products with tens of millions of MOSFET devices, such as a dynamic random access memory (DRAM), the subthreshold current often causes extra energy loss or power consumption. As a result, when designing a circuit, the subthreshold current must be taken into account.

FIG. 1 is a current-voltage (I-V) characteristic curve of MOSFETs. In an I-V curve, the x axis is the gate-to-source voltage ($V_{GS}$) and the y axis is the drain current ($I_D$). In a MOSFET, the current-switching process involves a thermionic emission of electrons over an energy barrier, causing the I-V curve of the MOSFET to comprise three regions: a linear region 10, a quadratic region 20 and a subthreshold region 30, as shown in FIG. 1. Subthreshold swing (SS) is an important parameter of a MOSFET's I-V characteristic, which describes an exponential behavior of the current as a function of the voltage. The subthreshold swing is the reciprocal value of the subthreshold slope S of an I-V curve in the subthreshold region 30. When a MOSFET operates in the subthreshold region 30, the subthreshold swing (SS) describes the gate-to-source voltage ($V_{GS}$) required to change the drain current ($I_D$) by an order of magnitude, i.e., ten times. The subthreshold swing is usually given as:

$$SS = \frac{1}{S} = \left(1 + \frac{C_d}{C_{ox}}\right) \cdot \ln 10 \frac{k_B T}{q},$$

wherein $C_d$ and $C_{ox}$ respectively represent the depletion layer capacitance and the gate-oxide capacitance;

$$\frac{k_B T}{q}$$

is referred to as thermal voltage, in which $k_B$ is the Boltzmann constant, i.e., $1.381 \times 10^{-23}$ J/K, T is the absolute temperature and q is the charge of a single electron, i.e., $1.602 \times 10^{-19}$ C. The minimum theoretical subthreshold swing of a MOSFET can be found by supposing the capacitance of the gate oxide of the transistor is much greater than the capacitance of the channel depletion region, i.e., $$\frac{C_d}{C_{ox}} \sim 0,$$

which yields $$SS \sim \ln 10 \frac{k_B T}{q} \sim 60 \text{ mV/decade at room temperature } (T = 300 \text{ K}).$$

The 60 mV/decade of a subthreshold swing value physically means that when the drain current increases by an order of magnitude (10 times), a minimum gate-to-source voltage of 60 mV for driving the transistor is required. Generally, the required SS shall be as small as possible, because this means that the gate has a greater control capability for the subthreshold current.

In addition, the subthreshold swing is a performance indicator that measures the mutual conversion rate between the on and off states of a transistor. According to the equation, $$SS \sim \frac{V_{DD}}{\log \frac{I_{on}}{I_{off}}},$$

wherein $V_{DD}$ is the supply voltage of a MOSFET; $I_{on}$ and $I_{off}$ represent the on-current and off-current, respectively. The on-current $I_{on}$ refers to the current when $V_{GS}>V_{TH}$ and is proportional to the transistor speed, i.e., the higher the on-current, the faster a transistor may work. The off-current $I_{off}$ refers to the current when $V_{GS}<V_{TH}$. The greater $$\frac{I_{on}}{I_{off}}$$

ratio means that it is easier to distinguish the on and off states of a transistor. Because SS is reciprocally proportional to $$\log\frac{I_{on}}{I_{off}},$$

the smaller the SS is, the greater the $$\frac{I_{on}}{I_{off}}$$

ratio is. Therefore, a transistor characterized by a smaller subthreshold swing exhibits a faster transition between off and on states.

With the increasing number of transistors per unit area, the channel length is continuously decreasing. Therefore, the subthreshold leakage becomes one of the major contributors to power consumption. In order to effectively reduce the size of the subthreshold swing and improve the operating performance of transistors, the exploration of new physical systems is urgently needed. A tunneling field-effect transistor (TFET) is a novel type of transistor. Even though the structure of TFET is very similar to that of a MOSFET, the fundamental switching mechanism differs, making this device a promising candidate for low-power electronics.

Figure 2:
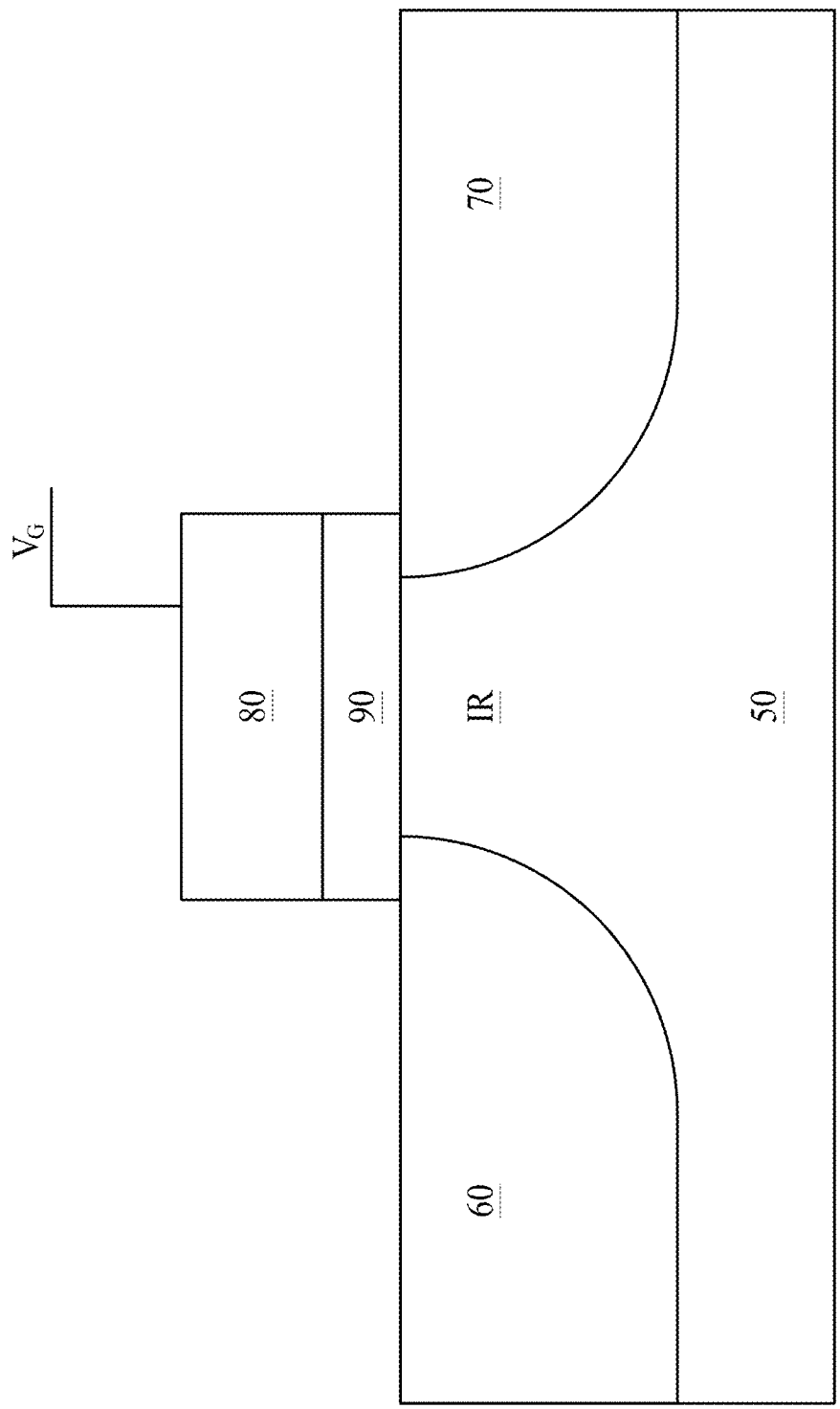
FIG. 2 is a schematic diagram of a tunneling field-effect transistor TFET, in accordance with some embodiments of the present disclosure.

FIG. 2 is a schematic diagram of a TFET 40, wherein the TFET 40 comprises a substrate 50, a source terminal 60, a drain terminal 70 and a gate terminal 80. The gate terminal 80 is formed over the substrate 50 and spaced from the substrate 50 by a gate oxide 90. The main difference between the TFET and a MOSFET is that, the source terminal 60 and the drain terminal 70 are doped with opposite types of dopants in the TFET. For example, when the source terminal 60 is doped with p-type dopants and forms a p-type doped region, the drain terminal 70 will be doped with n-type dopants and form an n-type doped region. In addition, the substrate 50 has an intrinsic region IR without any significant dopant. Therefore, the source terminal 60, the intrinsic region IR of the substrate 50 and the drain terminal 70 form a P-I-N junction (p-type, intrinsic, n-type), wherein the electrostatic potential of the intrinsic region IR is controlled by the gate terminal 80. An n-type TFET is operated by applying a gate voltage $V_G$ at the gate terminal 80 so that electron accumulation occurs at the intrinsic region IR. When the gate voltage $V_G$ is large enough, band-to-band tunneling (BTBT) occurs when the conduction band of the intrinsic region IR aligns with the valence band of the p-type doped region in the source terminal 60. Electrons from the valence band of the p-type doped region in the source terminal 60 tunnel into the conduction band of the intrinsic region IR and current can flow across the TFET 40.

A tunneling field-effect transistor is switched by modulating quantum tunneling through a barrier instead of modulating thermionic emission over a barrier as in traditional MOSFETs. Because of this, TFETs are not limited by the thermal Maxwell-Boltzmann tail of carriers, which limits MOSFET drain current subthreshold swing to about 60 mV/decade of current at room temperature. In addition, in the off state of TFETs, no empty states are available in the channel for tunneling from the source, so the off-current is very low. Due to the special current conduction mechanism of band to band tunneling, TFET may offer the potential benefits of fast switching, small subthreshold swing, low off-current and other characteristics.

A buried-channel-array transistor (BCAT) is a kind of transistor in which a word line (or a gate terminal) is buried in a semiconductor substrate. In some embodiments, the BCAT structure is employed in a semiconductor device with an aim to increase the effective channel length. However, in conventional BCAT devices, the large subthreshold swing is still a fundamental limit. Therefore, in an embodiment of the present disclosure, a semiconductor device comprising both a BCAT structure and a TFET structure is provided. The semiconductor device may provide the advantages of both the BCATs and the TFETs.

Figure 3:
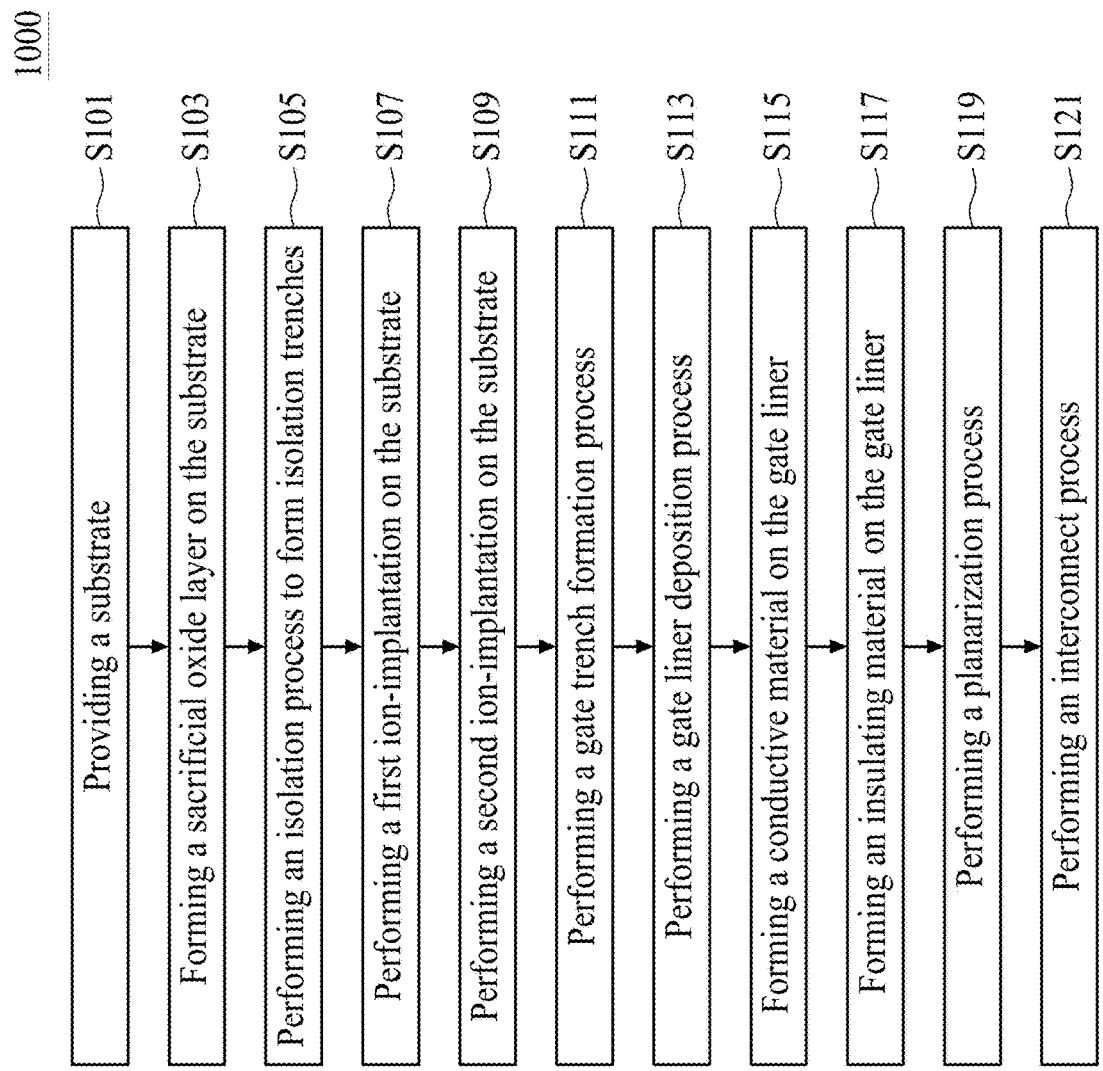
FIG. 3 is a flow diagram showing a method for fabricating a semiconductor device, in accordance with some embodiments of the present disclosure.
Figure 19:
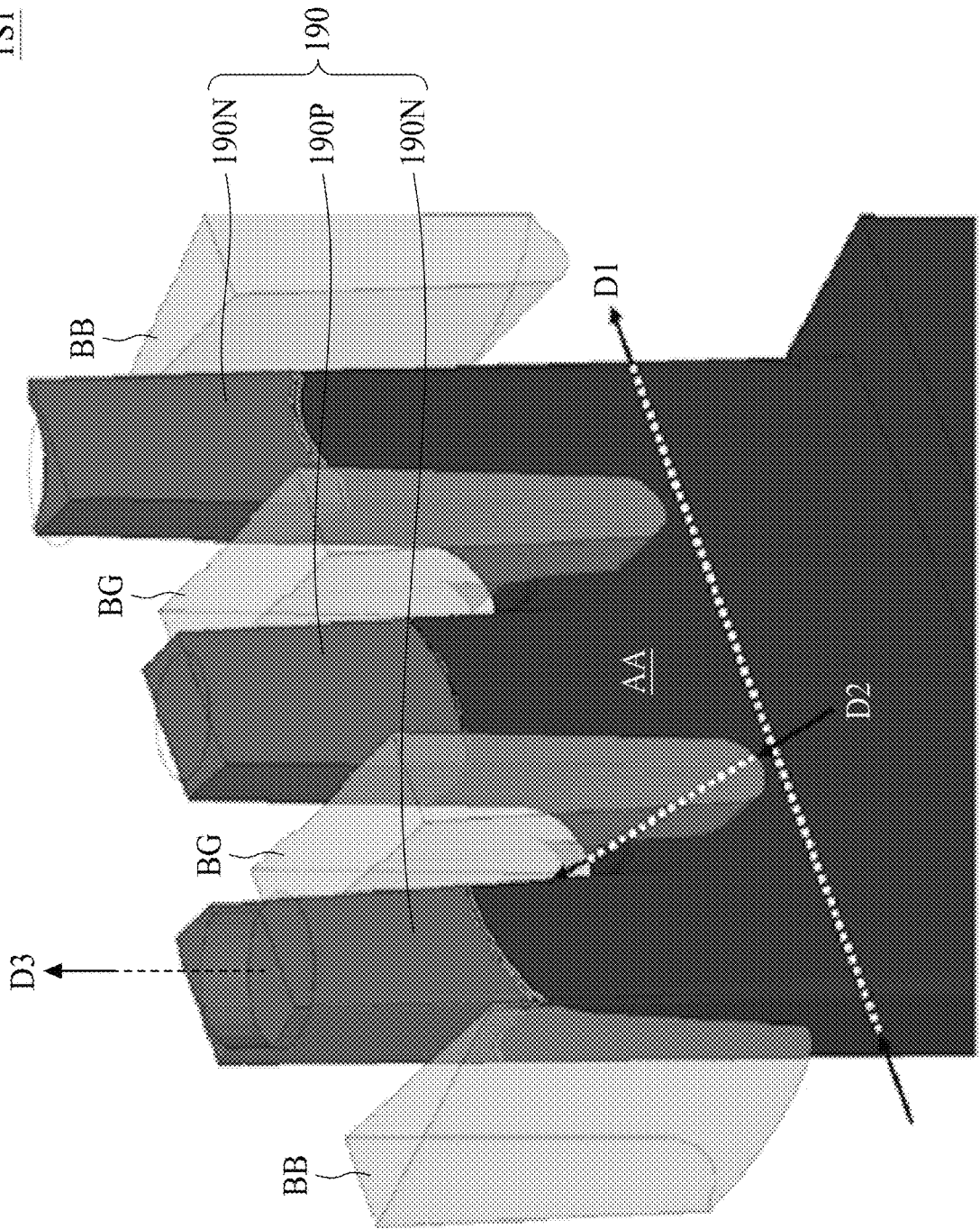
FIG. 19 is a schematic perspective view of the semiconductor device in FIG. 18, in accordance with some embodiments of the present disclosure.
Figure 20:
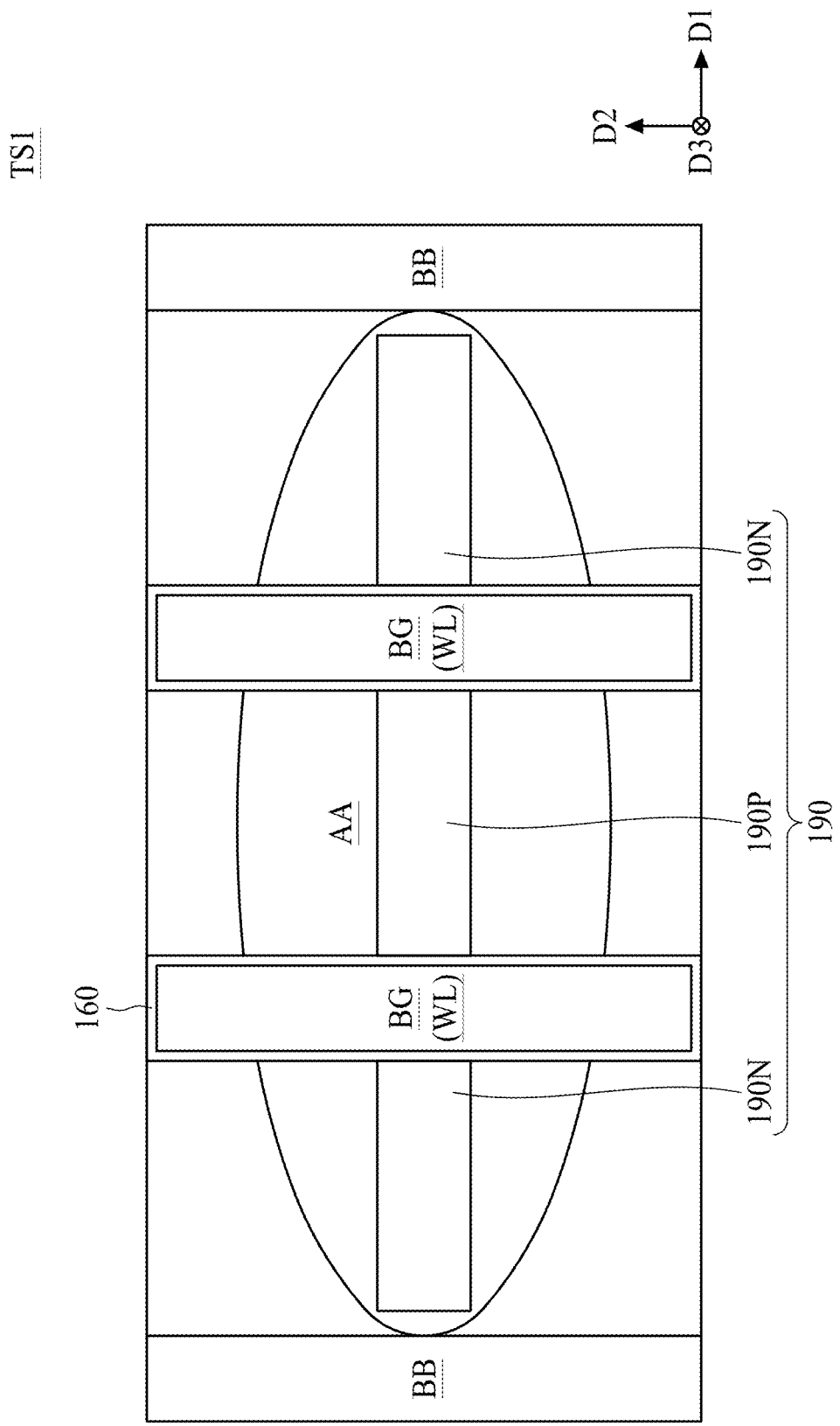
FIG. 20 is a schematic top view of the semiconductor device in FIG. 18, in accordance with some embodiments of the present disclosure.

One aspect of the present disclosure provides a method for fabricating a semiconductor device. FIG. 3 is a flow diagram of a method 1000 for fabricating the semiconductor device, in accordance with some embodiments of the present disclosure. Specifically, the method 1000 may be utilized to fabricate a buried-channel-array transistor. FIG. 5 to FIG. 18 are schematic cross-sectional views illustrating sequential fabrication stages according to the method 1000 in FIG. 3, in accordance with some embodiments of the present disclosure. FIG. 19 and FIG. 20 are respectively a schematic perspective view and a top view of the semiconductor device in FIG. 18, in accordance with some embodiments of the present disclosure.

Figure 4:
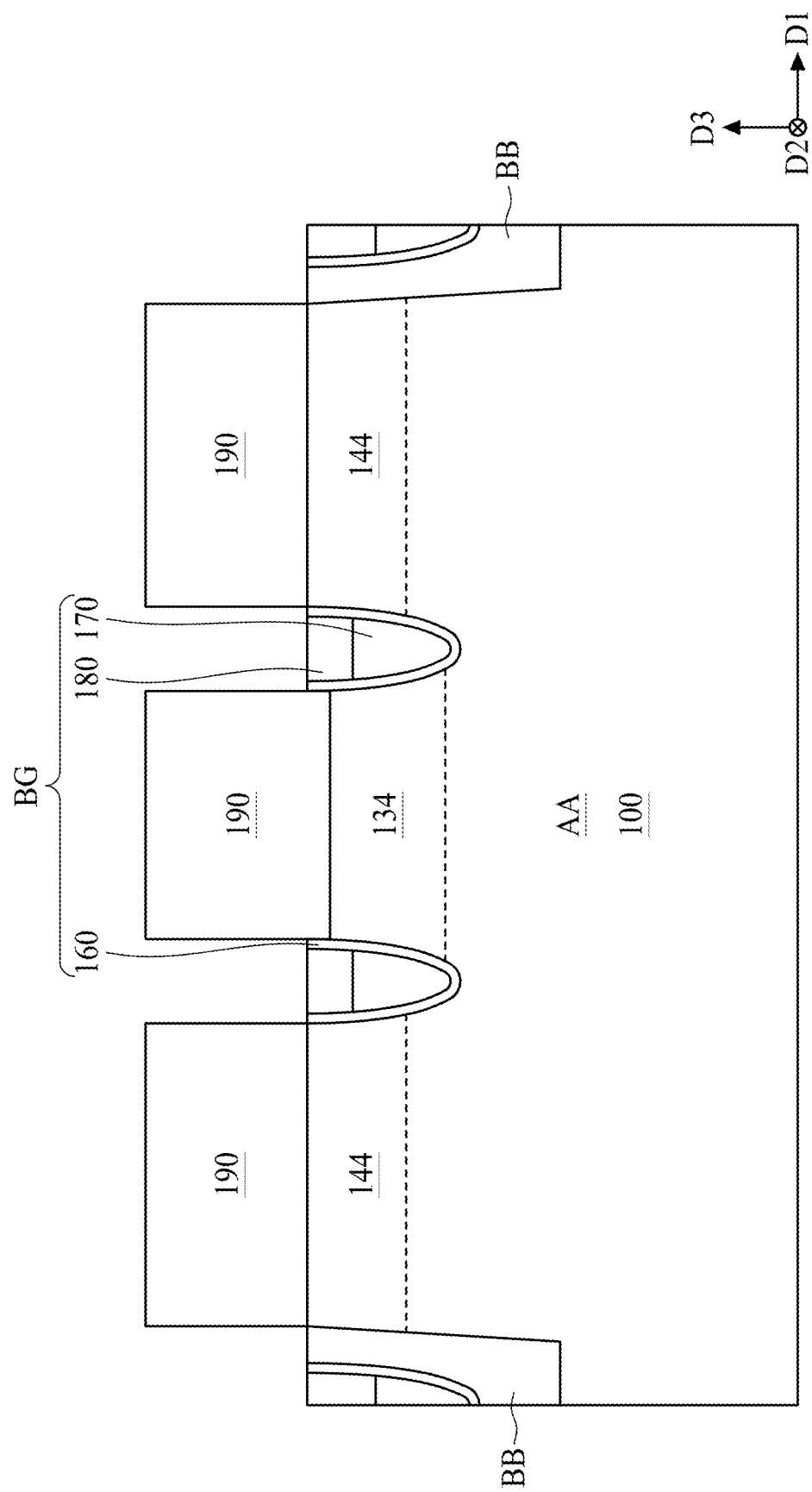
FIG. 4 is a schematic diagram illustrating a semiconductor device, in accordance with some embodiments of the present disclosure.

Another aspect of the present disclosure provides a semiconductor device. FIG. 4 is a schematic cross-sectional view of a semiconductor device TS1, in accordance with some embodiments of the present disclosure. With reference to FIG. 4, the semiconductor device TS1 comprises a substrate 100, a plurality of isolation regions BB in the substrate 100, and an active region AA surrounded by the isolation regions BB. A p-type doped region 134 is interposed between two of a plurality of n-type doped regions 144 in the substrate 100. A plurality of buried gate structures BG are formed in the substrate 100 and disposed between the p-type doped region 134 and one of the plurality of n-type doped regions 144, i.e., the p-type doped region 134 and the n-type doped region 144 are at two opposite sides of the buried gate structure BG. The buried gate structure BG comprises a gate conductive material 170, a gate insulating layer 180 disposed over the gate conductive material 170 and a gate liner 160 surrounding the gate conductive material 170 and the gate insulating layer 180. A plurality of contact plugs 190 are formed on the p-type doped region 134 and the n-type doped region 144. The contact plugs 190 include at least a contact plug 190P connected to the p-type doped region 134 and at least a contact plug 190N connected to the n-type doped region 144. The contact plug 190P is partially embedded in the p-type doped region 134, i.e., a portion of the contact plug 190P is embedded in the p-type doped region 134. The plurality of buried gate structures BG are arranged along a first direction D1, and each of the buried gate structures BG extends in a second direction D2 substantially perpendicular to the first direction D1. In addition, each of the contact plugs 190 extends in a third direction D3 substantially perpendicular to the first direction D1 and the second direction D2.

Figure 5:
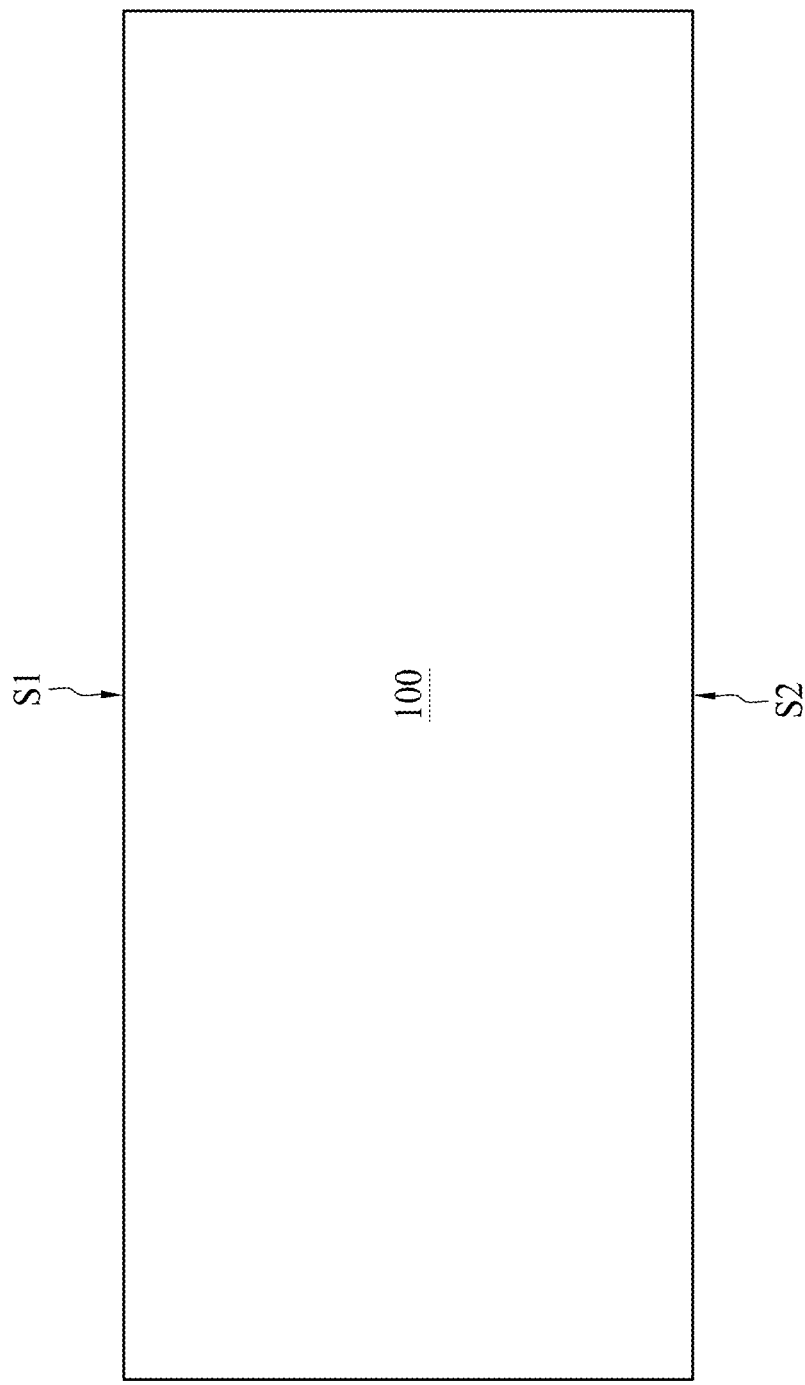
FIG. 5 to FIG. 18 are schematic cross-sectional views illustrating sequential stages according to the method in FIG. 3, in accordance with some embodiments of the present disclosure.

With reference to FIG. 5, a substrate 100 is provided according to step S101 in FIG. 3. The substrate 100 has an approximately planar first surface S1 and an approximately planar second surface S2 remote from the first surface S1. In some embodiments, the substrate 100 may include silicon (Si), silicon germanium (SiGe), gallium arsenide (GaAs), or other suitable semiconductor materials.

Figure 6:
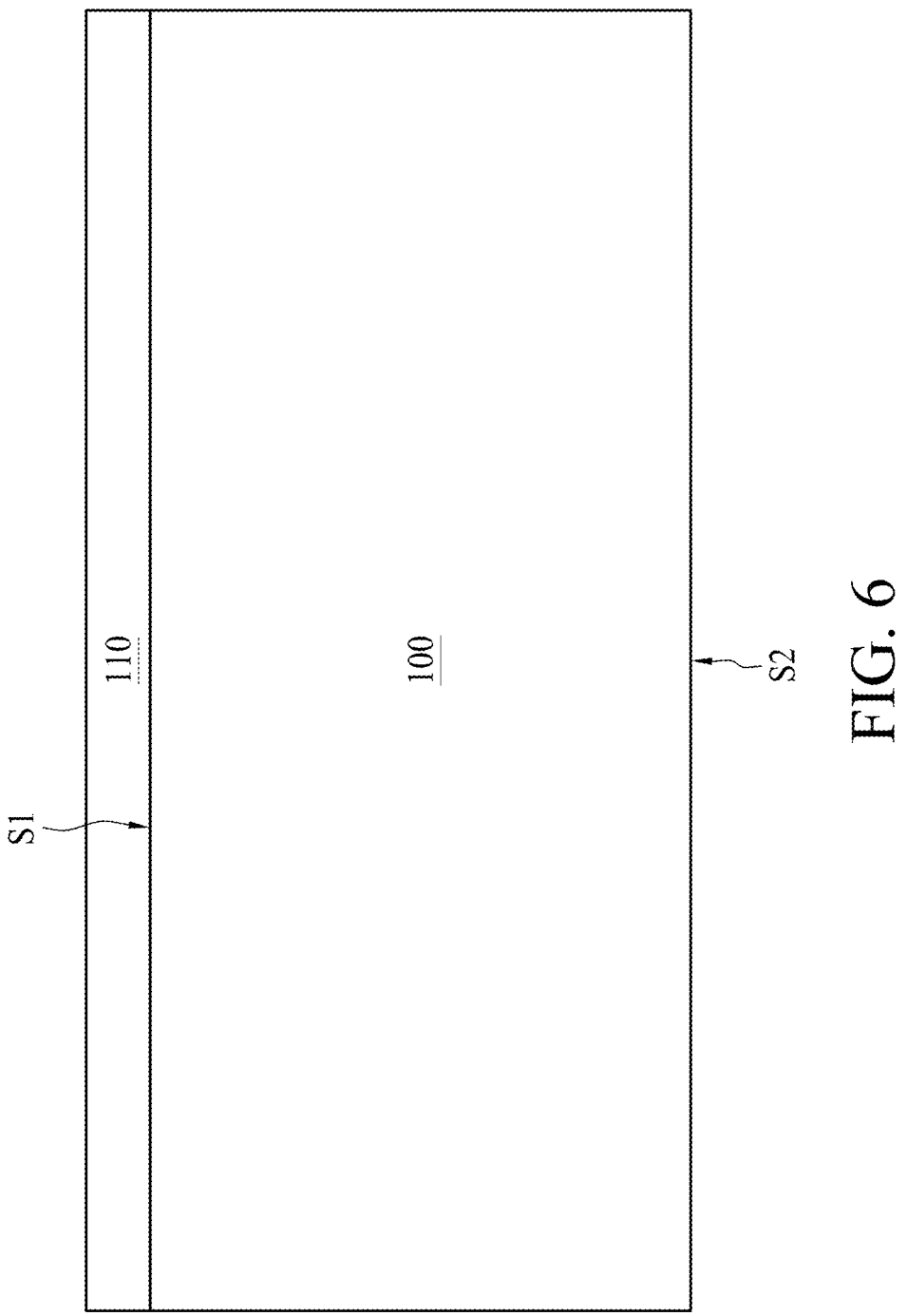

With reference to FIG. 6, a sacrificial oxide layer 110 is formed on the first surface S1 of the substrate 100 according to step S103 in FIG. 3. In some embodiments, the sacrificial oxide layer 110 may be formed by a thermal oxidation process or any other suitable process. In some embodiments, the sacrificial oxide layer 110 can be utilized to prevent the first surface S1 of the substrate 100 from being contaminated by defects or damaged by a subsequent ion-implantation process. In addition, the sacrificial oxide layer 110 may be used as a screen oxide to help control the depth of doping ions in the ion-implantation process. In some embodiments, before the sacrificial oxide layer 110 is formed, a silicon nitride layer (not shown) may be formed over the first surface S1 of the substrate 100. The silicon nitride layer can be utilized to electrically insulate conductive components. In addition, the silicon nitride layer may protect active regions defined by the ion-implantation process. In some embodiments, before the silicon nitride layer is formed, a pad oxide layer (not shown) may be formed on the first surface S1 of the substrate 100. The pad oxide layer can be utilized to reduce an interfacial stress between the substrate 100 and the silicon nitride layer.

Figure 7:
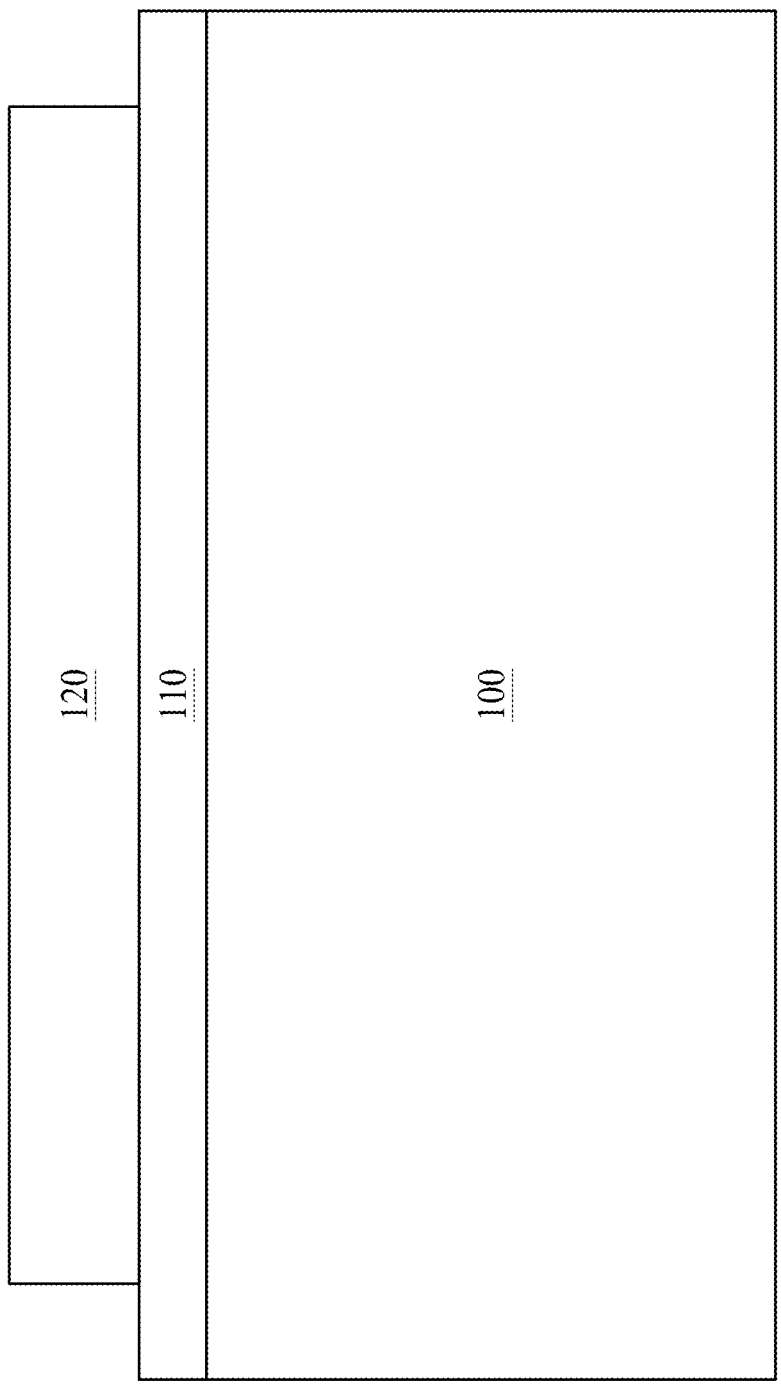
Figure 8:
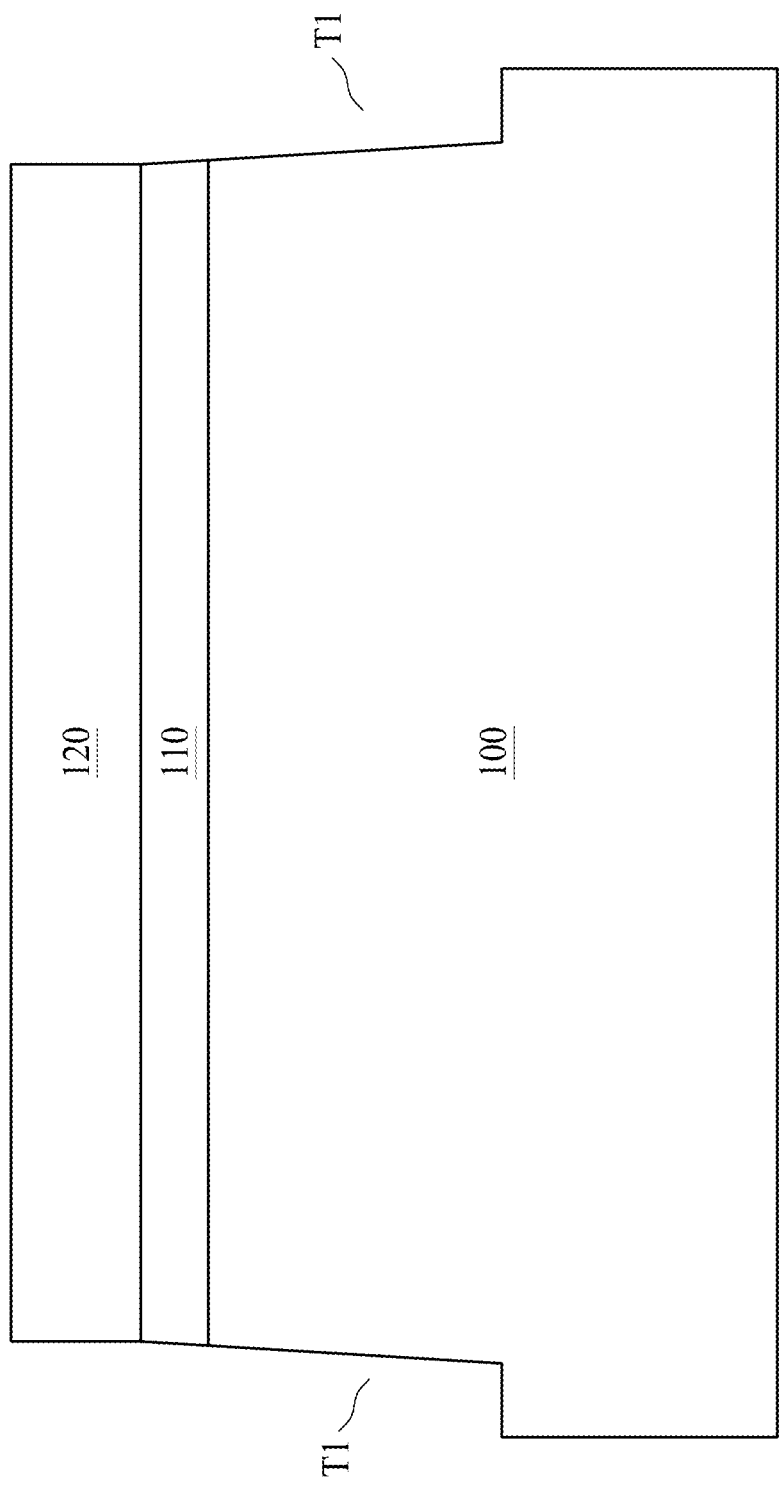

With reference to FIG. 7, an isolation process is performed on the substrate 100 according to step S105 in FIG. 3. In some embodiments, the isolation process may be a shallow trench isolation (STI) formation process. Specifically, the STI formation process at least includes a lithographic process, an etching process and a deposition process. Still referring to FIG. 7, first, a first patterned photoresist 120 is formed on the substrate 100 to define the location of isolation regions. Next, with reference to FIG. 8, the substrate 100 and the sacrificial oxide layer 110 are etched using the first patterned photoresist 120 as an etching mask. Specifically, portions of the substrate 100 and the sacrificial oxide layer 110 that are exposed through the first patterned photoresist 120 are removed. Therefore, multiple isolation trenches T1 are formed in the substrate 100. The first patterned photoresist 120 is then removed.

Figure 9:
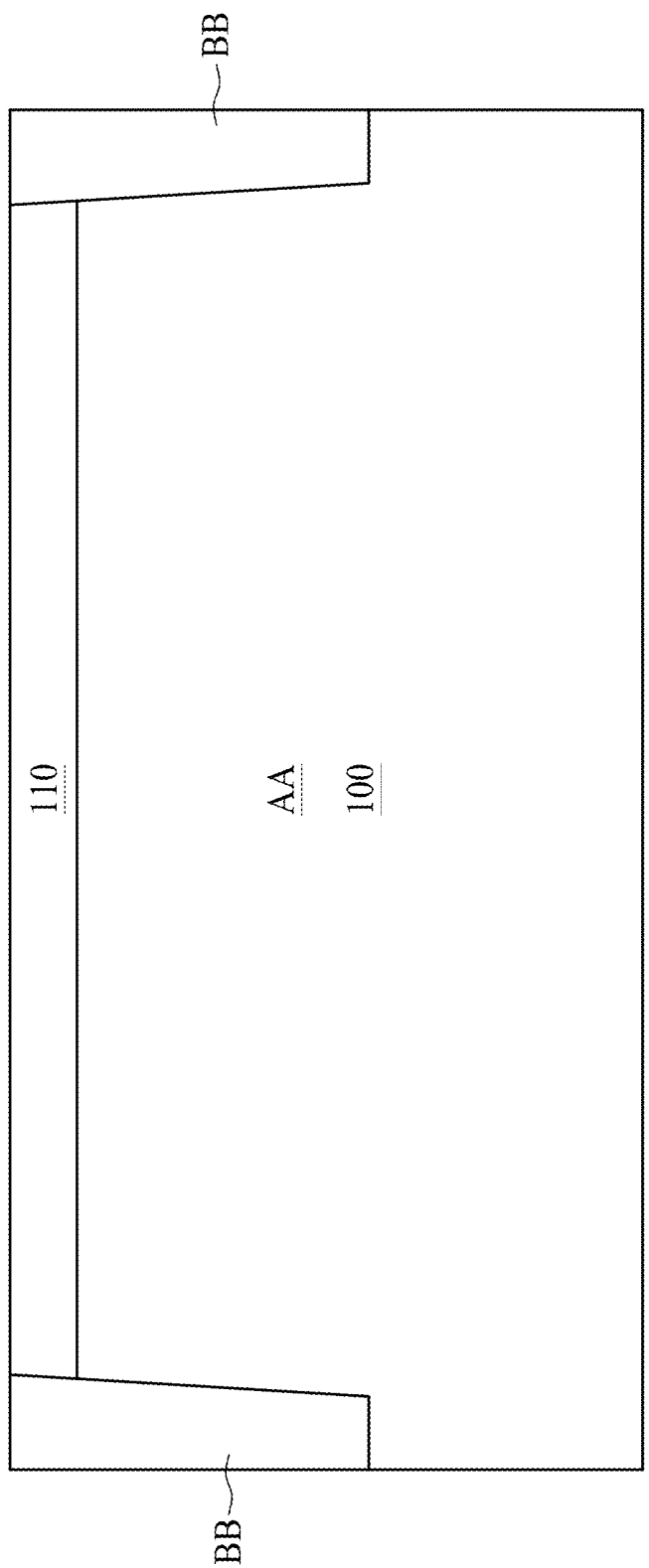

Subsequently, with reference to FIG. 9, the isolation trenches T1 are filled with an insulating material. In some embodiments, the insulating material may include at least one of, e.g., tetraethyl orthosilicate (TEOS), boron phosphorus silicate glass (BPSG), and/or undoped silicate glass (USG). At such time, the isolation trenches T1 filled with the insulating material form isolation regions BB. In some embodiments, the isolation region BB may be repetitively arranged in the substrate 100 at predetermined intervals. In some embodiments, an active region AA may be surrounded by a plurality of isolation regions BB and the active region AA may be repetitively arranged in the substrate 100 at predetermined intervals.

Figure 10:
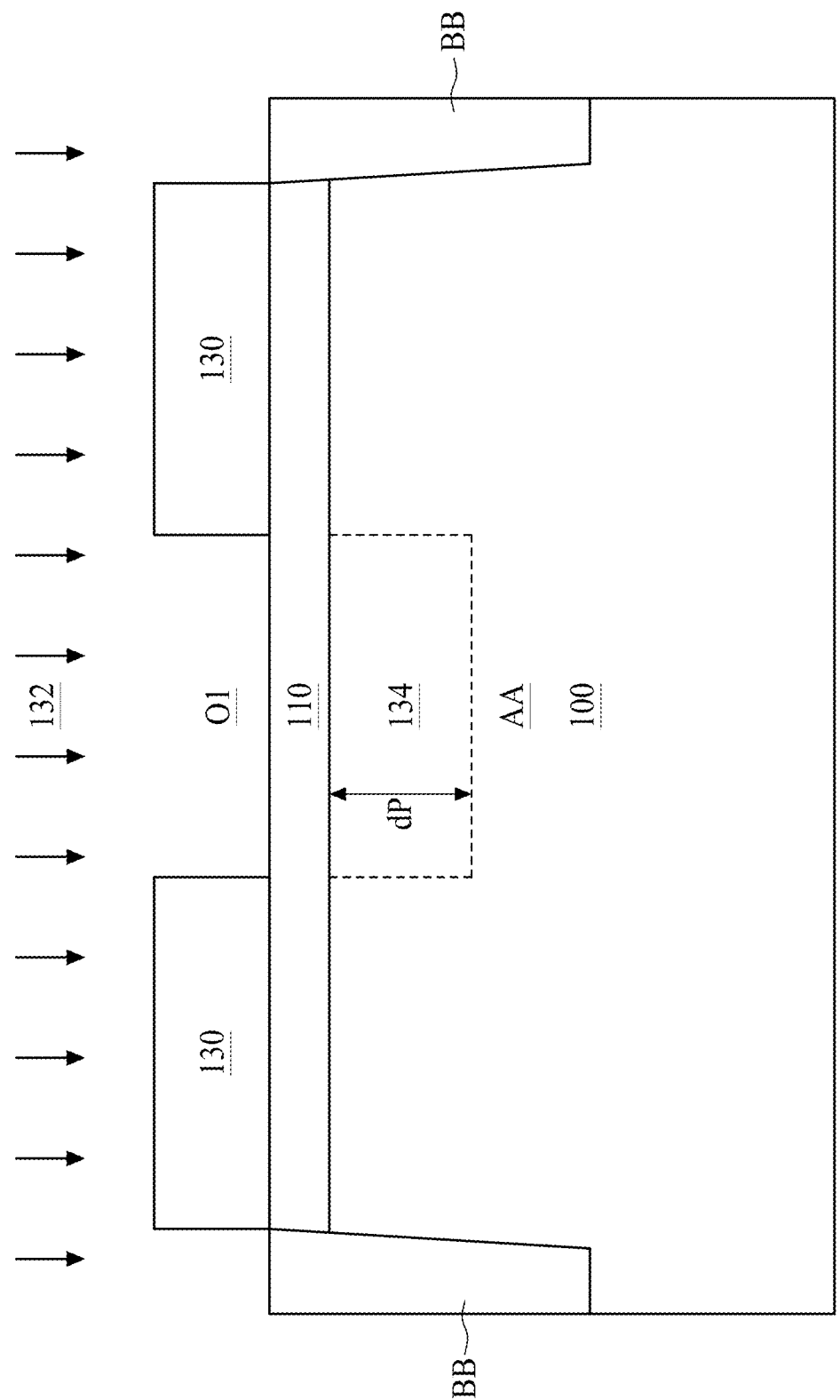

With reference to FIG. 10, a first ion-implantation is performed on the substrate 100 according to step S107 in FIG. 3. Specifically, a first implant mask 130 may be formed on the active region AA, wherein the first implant mask 130 includes an opening O1 which exposes the sacrificial oxide layer 110. Subsequently, dopants of group IIIA 132 are implanted into the active region AA through the opening O1 to a first depth dP in the substrate 100. At such time, the active region AA corresponding to the opening O1 forms a p-type doped region 134. The p-type doped region 134 is a so-called P-well region, which has electron holes as the majority carrier. In some embodiments, after the p-type doped region 134 is formed, the first implant mask 130 is removed and an annealing process is performed to repair the damage caused by the first ion-implantation and/or activate the implanted group IIIA dopants.

Figure 11:
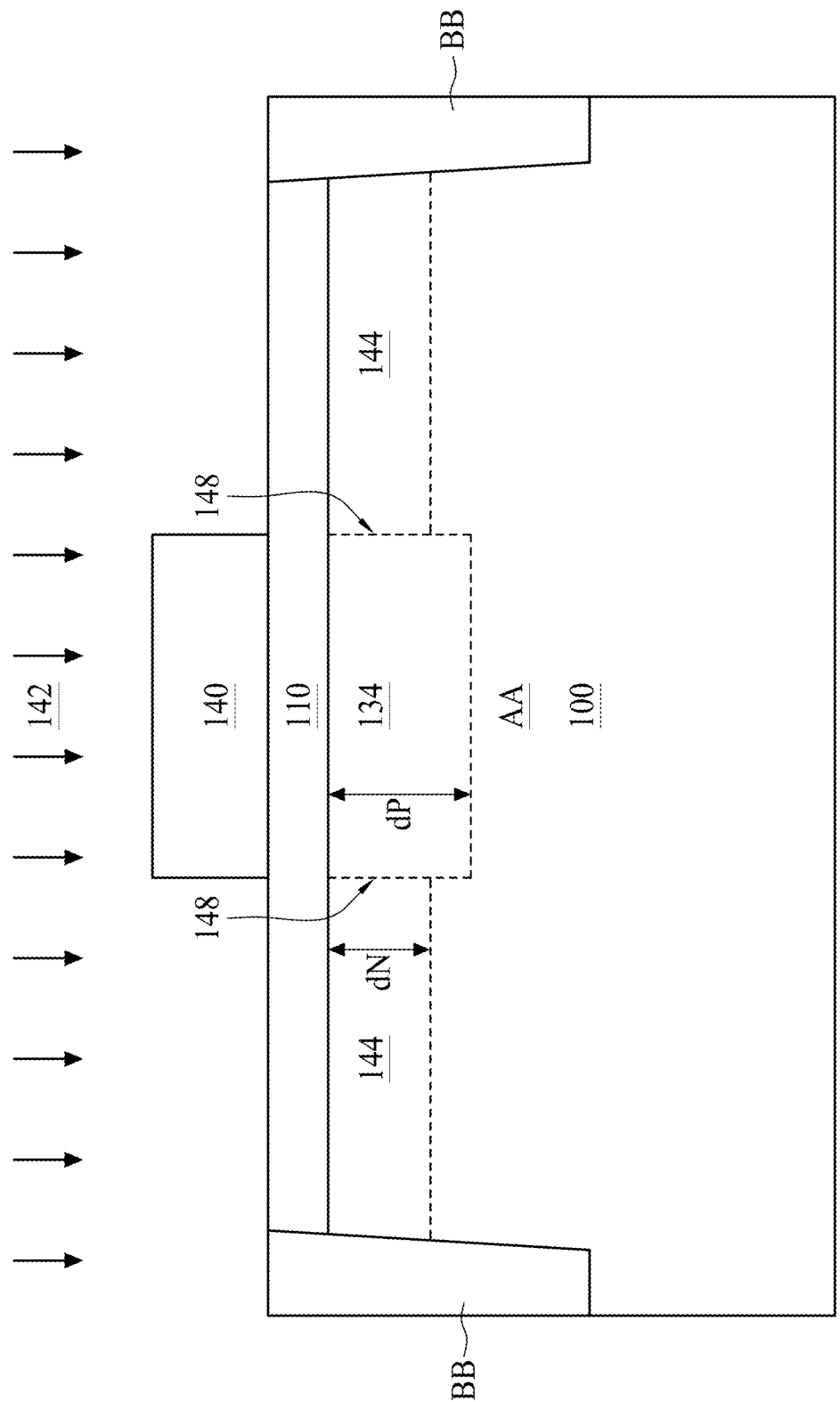

With reference to FIG. 11, a second ion-implantation is performed on the substrate 100 according to step S109 in FIG. 3. Specifically, a second implant mask 140 may be formed on the active region AA, wherein the second implant mask 140 covers the p-type doped region 134. Subsequently, dopants of group VA 142 are implanted into portions of the active region AA not covered by the second implant mask 140 to a second depth dN in the substrate 100. At such time, portions of the active region AA form n-type doped regions 144. The n-type doped region 144 is a so-called N well region, which has electrons as the majority carrier. In some embodiments, the first depth dP is greater than the second depth dN. In addition, the p-type doped region 134 is surrounded by the n-type doped regions 144. Specifically, the p-type doped region 134 is interposed between the n-type doped regions 144. In some embodiments, an interface 148 exists between the n-type doped region 144 and the p-type doped region 134, wherein the interface 148 is a boundary where the dopant abruptly changes. In some embodiments, after the n-type doped region 144 is formed, the second implant mask 140 is removed and an annealing process is performed to repair the damage caused by the second ion-implantation and/or activate the implanted group VA dopants.

Figure 12:
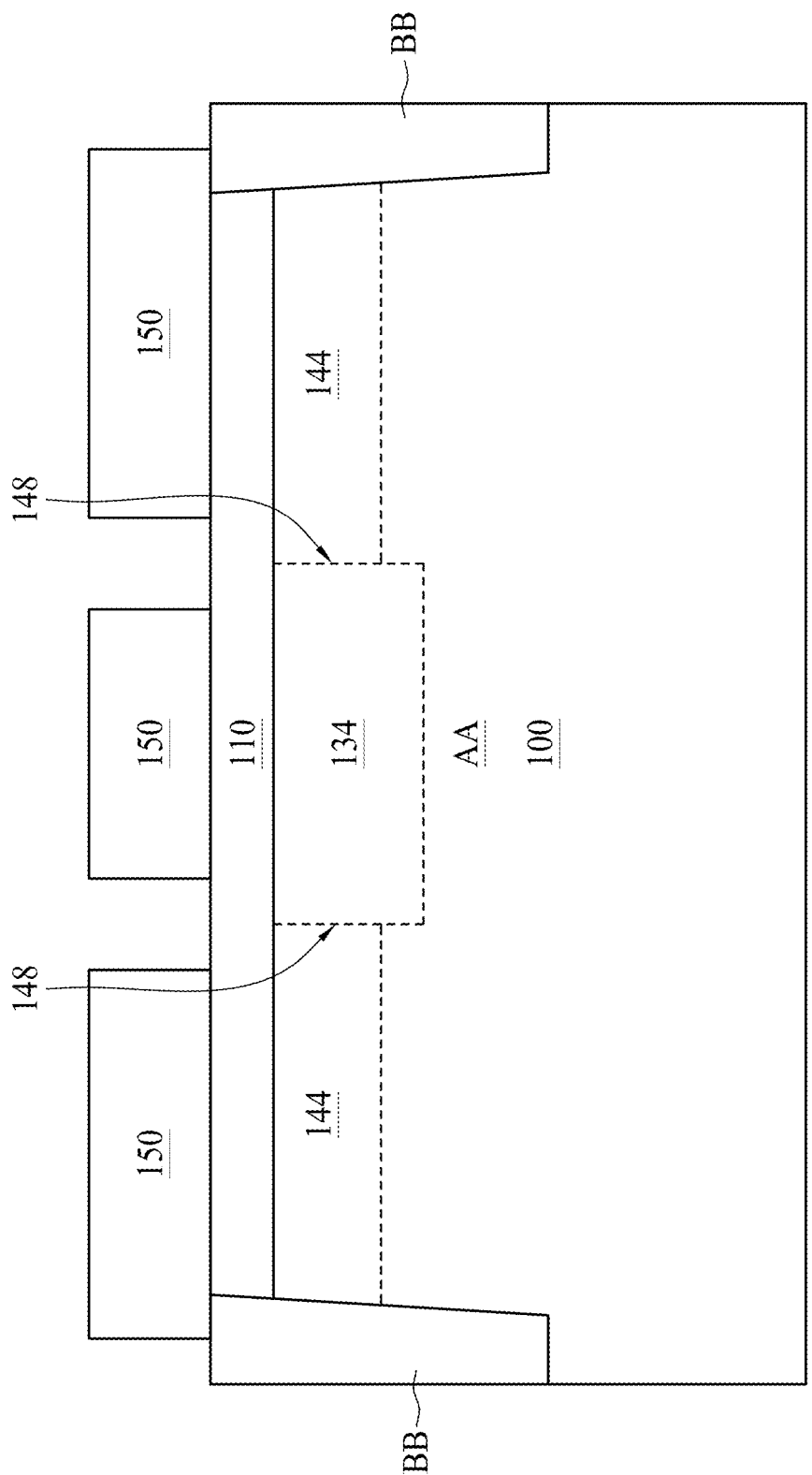

With reference to FIG. 12, a gate trench formation process is performed on the substrate 100 according to step S111 in FIG. 3. In some embodiments, the gate trench formation process may be a recess formation process. Specifically, the recess formation process at least includes a lithographic process and an etching process. First, a second patterned photoresist 150 is formed on the substrate 100, wherein the second patterned photoresist 150 exposes a surface of the isolation region BB and a surface of the sacrificial oxide layer 110 over the interface 148 between the n-type doped region 144 and the p-type doped region 134.

Figure 13:
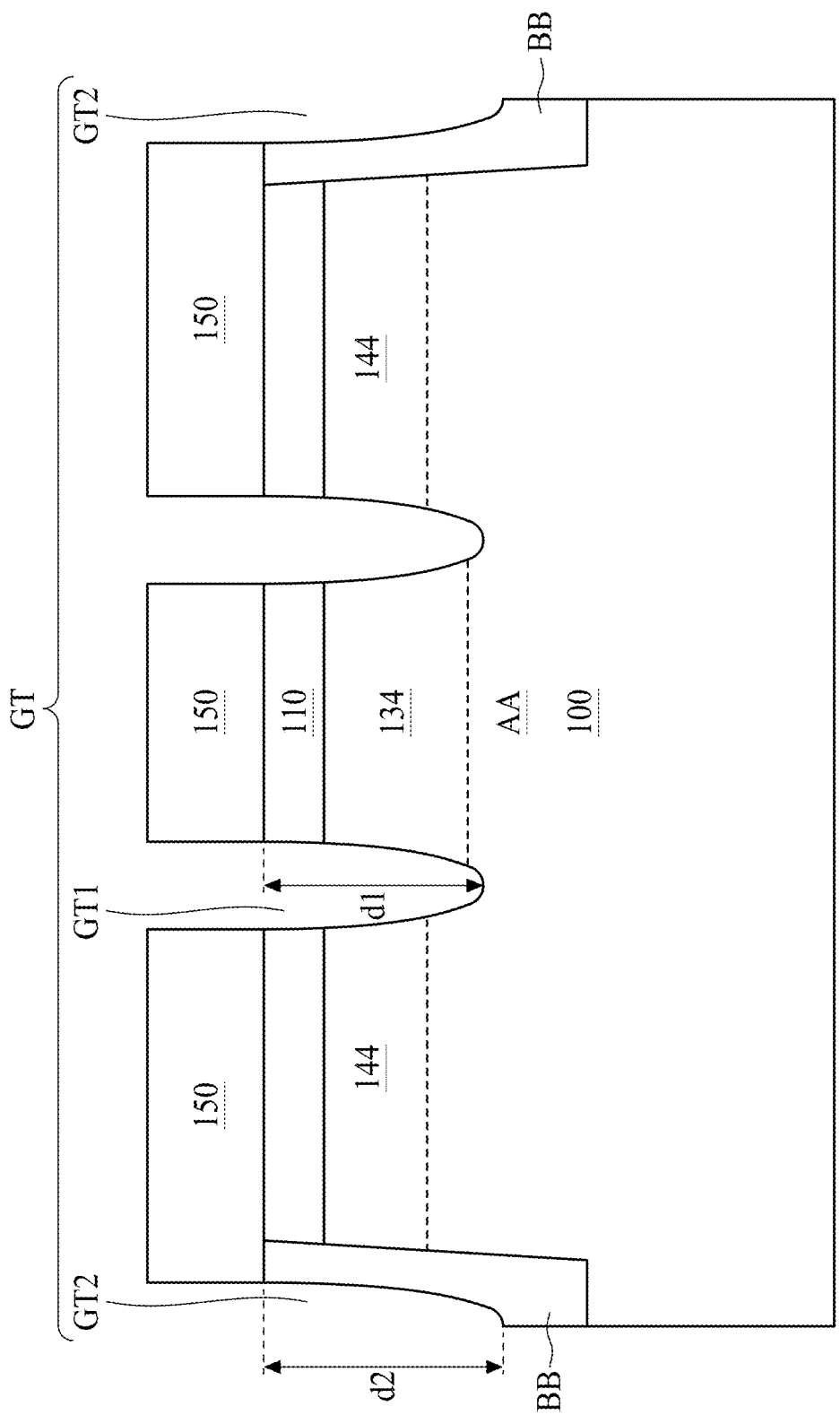

Subsequently, with reference to FIG. 13, the sacrificial oxide layer 110, the active region AA and the isolation region BB are etched using the second patterned photoresist 150 as an etching mask. Specifically, portions of the sacrificial oxide layer 110, the active region AA and the isolation region BB that are exposed through the second patterned photoresist 150 are removed. Therefore, multiple gate trenches GT are formed. In some embodiments, the gate trenches GT comprise first gate trenches GT1 and second gate trenches GT2. The first gate trenches GT1 are formed in the active region AA and the second gate trenches GT2 are formed in the isolation region BB. In addition, the first gate trenches GT1 are located at the interface 148 between the p-type doped region 134 and the n-type doped region 144. In some embodiments, the first gate trenches GT1 have a first depth d1 and the second gate trenches GT2 have a second depth d2. In some embodiments, the second depth d2 is greater than the first depth d1. The second patterned photoresist 150 is then removed prior to the subsequent manufacturing stage.

Figure 14:
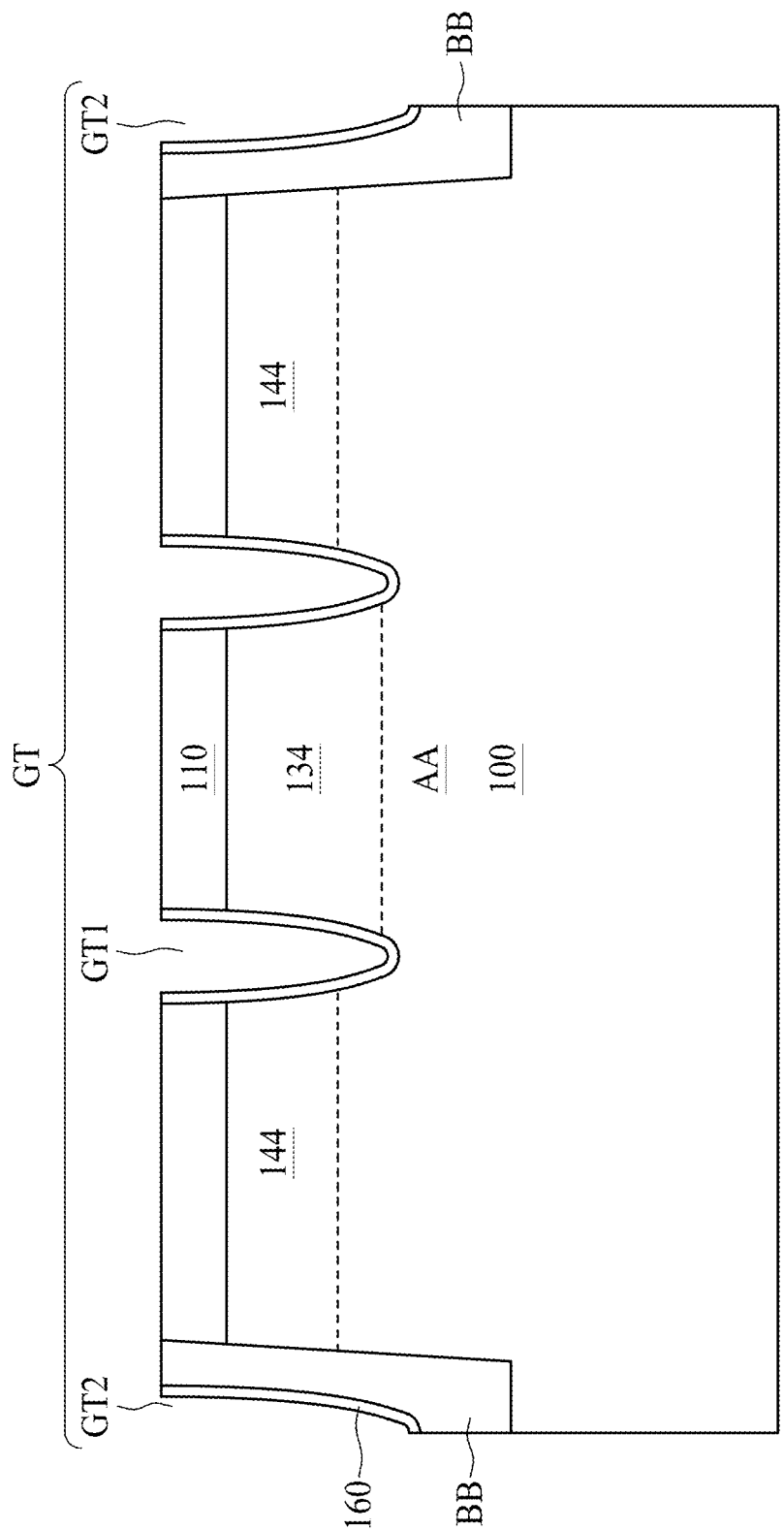

With reference to FIG. 14, a gate liner deposition process is performed on the substrate 100 according to step S113 in FIG. 3. In some embodiments, a gate liner 160 may be formed conformally within the gate trenches GT. Specifically, the gate liner 160 is formed on inner sidewalls of the first gate trenches GT1 and the second gate trenches GT2. In some embodiments, the gate liner 160 may be formed using a chemical vapor deposition (CVD) process or an atomic layer deposition (ALD) process. In some embodiments, the gate liner 160 can include various dielectric materials having high dielectric constant (high-κ). For example, the dielectric layer can include silicon oxide (SiO), silicon nitride (SiN), silicon oxynitride (SiON), metal oxide such as hafnium oxide (HfO), or other suitable materials chosen for compatibility, but the disclosure is not limited thereto.

Figure 15:
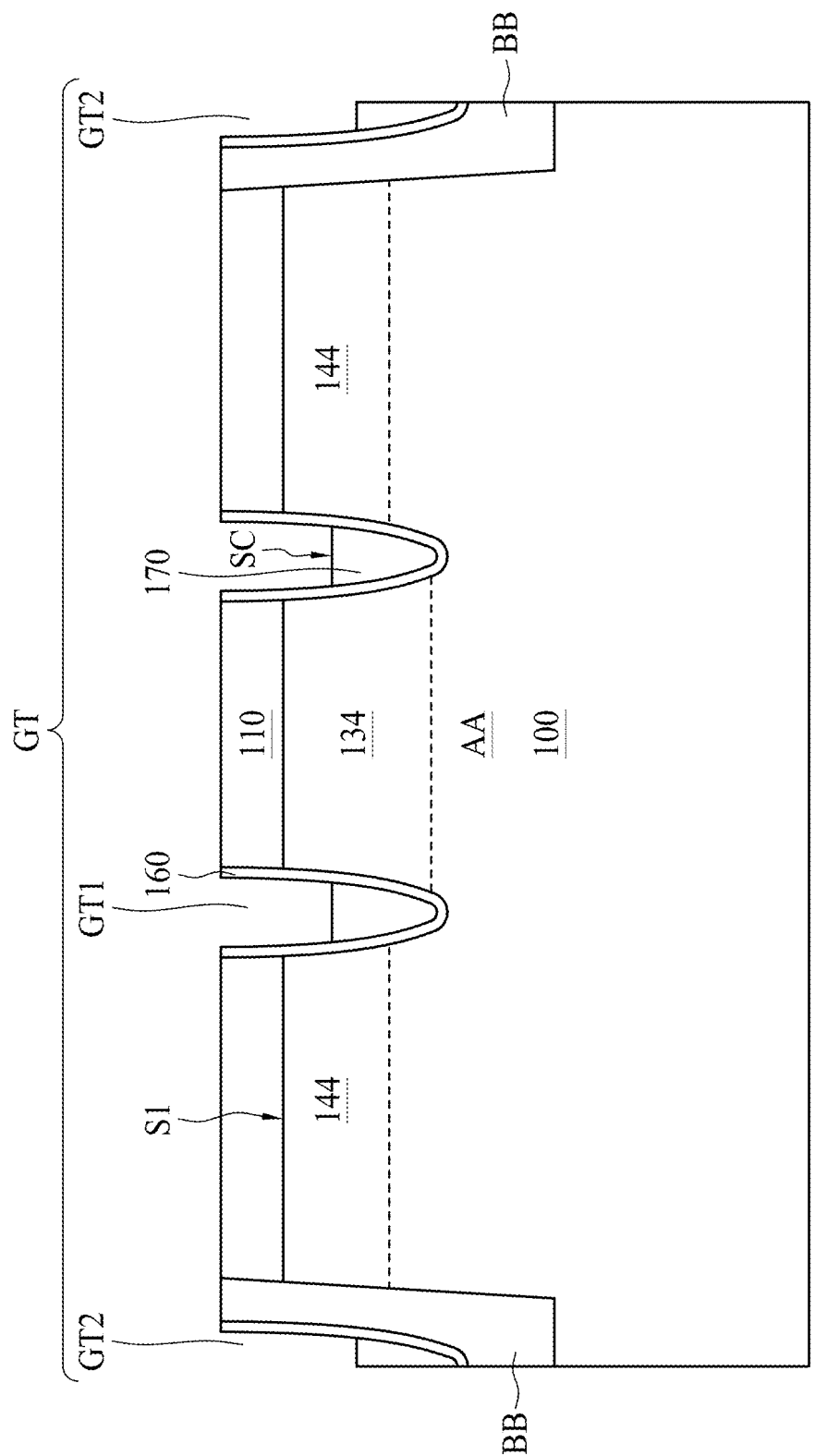

With reference to FIG. 15, a conductive material is formed on the gate liner 160 according to step S115 in FIG. 3. In some embodiments, a gate conductive material 170 may be deposited on the gate liner 160 and may partially fill the gate trenches GT. Specifically, the gate conductive material 170 fills a lower portion of the gate trenches GT. In some embodiments, a top surface SC of the gate conductive material 170 is lower than the first surface S1 of the substrate 100. In some embodiments, the gate conductive material 170 can include polysilicon or any other suitable material such as a metal with proper work function, but the disclosure is not limited thereto.

Figure 16:
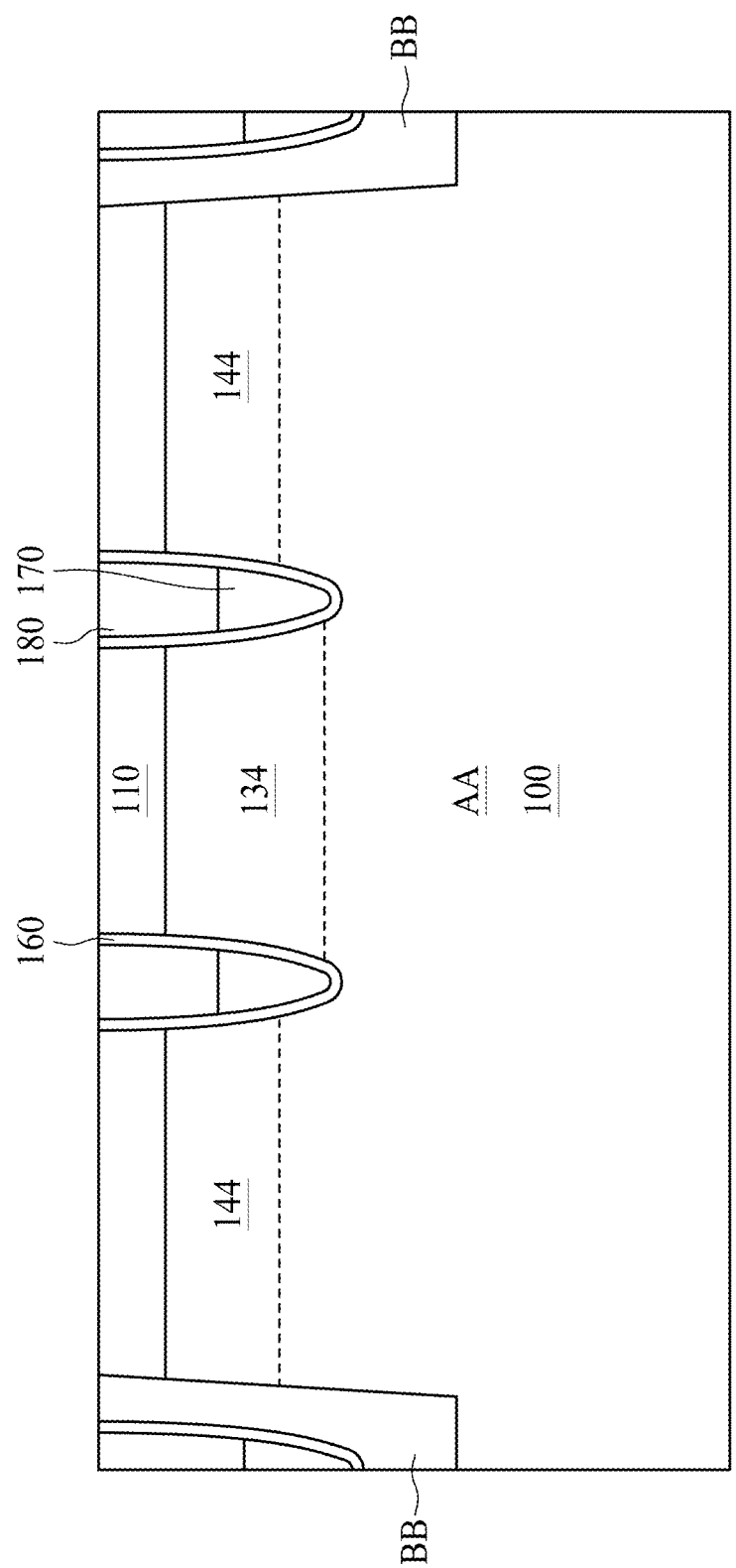

With reference to FIG. 16, an insulating material is formed on the gate liner 160 according to step S117 in FIG. 3. In some embodiments, a gate insulating layer 180 may be deposited on the gate conductive material 170 and may partially fill the gate trenches GT. Specifically, the gate insulating layer 180 fills an upper portion of the gate trenches GT to, e.g., isolate the gate conductive material 170. In some embodiments, the gate conductive material 170 can include polysilicon or other suitable materials such as metal materials with proper work function, but the disclosure is not limited thereto. In some embodiments, the gate insulating layer 180 can include silicon nitride (SiN) or any other suitable material which may reduce the possibility of an electrical short circuit and/or prevent an electrical short circuit from occurring.

Figure 17:
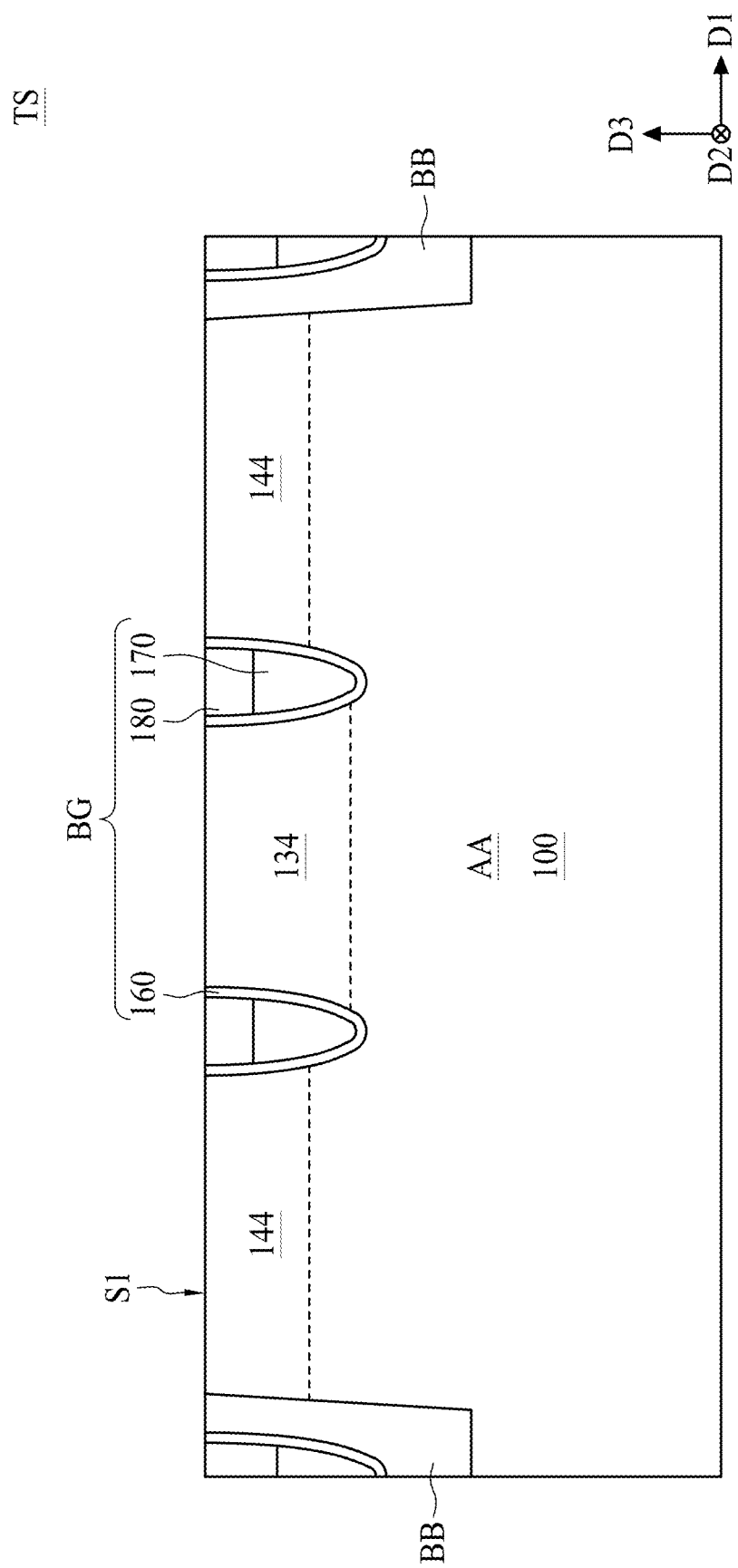

With reference to FIG. 17, a planarization process is performed on the substrate 100 according to step S119 in FIG. 3. In some embodiments, a chemical mechanical planarization (CMP) is performed to remove at least a portion of the sacrificial oxide layer 110 and a portion of the gate insulating layer 180, thereby exposing the first surface S1 of the substrate 100. In addition, the n-type doped region 144 and the p-type doped region 134 in the active region AA are exposed through the first surface S1. At such time, a semiconductor device TS is generally formed, in accordance with an embodiment of the present disclosure. In some embodiments, the gate liner 160, the gate conductive material 170 and the gate insulating layer 180 together form a buried gate structure BG. The p-type doped region 134 and the n-type doped region 144 are separated from each other by the buried gate structure BG. In some embodiments, the buried gate structure BG serves as a gate terminal. In addition, the p-type doped region 134 and the n-type doped region 144 at two opposite sides of the buried gate structure BG respectively form a source terminal and a drain terminal. In some embodiments, the buried gate structure BG may function as a transistor having a recess-type channel and serve as a buried word line in a DRAM device. In some embodiments, multiple buried gate structures BG may be arranged along a first direction D1, as shown in FIG. 17. In addition, each of the buried gate structures BG extends in a second direction D2 perpendicular to the first direction D1.

Figure 18:
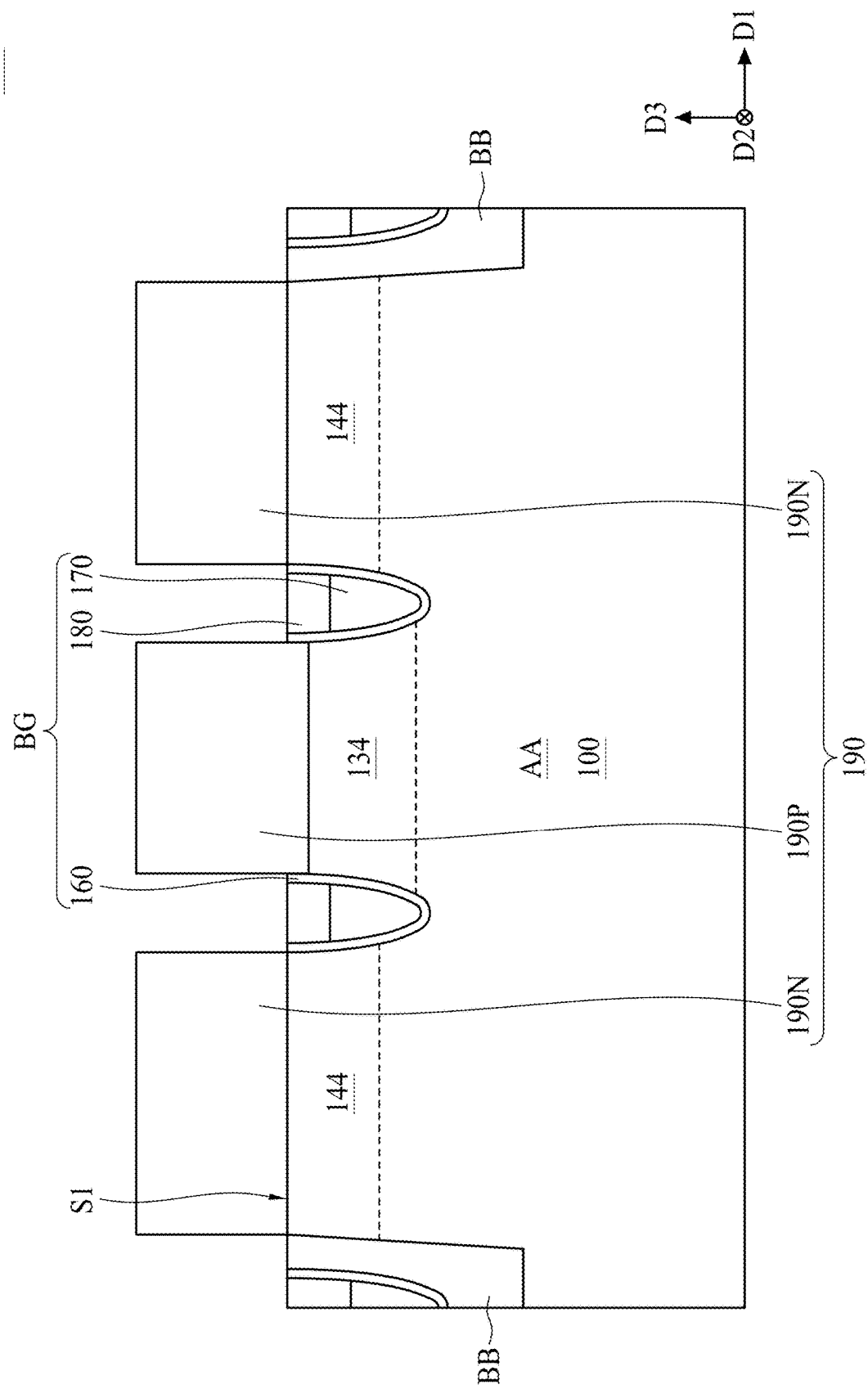

With reference to FIG. 18, an interconnect process is performed on the semiconductor device TS according to step S121 in FIG. 3. In some embodiments, multiple contact plugs 190 may be formed on the first surface S1 of the substrate 100. Specifically, the contact plugs 190 may include at least a contact plug 190P connected to the p-type doped region 134 and at least a contact plug 190N connected to the n-type doped region 144. In some embodiments, the contact plugs 190 may include various conductive materials, such as tungsten, copper, silver, gold, aluminum, and the like, to provide electrical connection of subsequently-formed components to the p-type doped region 134 and the n-type doped region 144 in the semiconductor device TS. In some embodiments, the contact plug 190P may be partially embedded in the p-type doped region 134, i.e., a portion of the contact plug 190P may be embedded in the p-type doped region 134. The contact plug 190P may therefore electrically connect the source terminal to a subsequently-formed bit line structure (not shown). In some embodiments, the contact plug 190N may electrically connect the drain terminal to a subsequently-formed cap structure (not shown). After the multiple contact plugs 190 are formed on the semiconductor device TS, a semiconductor device TS1 is generally formed, in accordance with an embodiment of the present disclosure.

FIG. 19 is a schematic perspective view of the semiconductor device TS1 in FIG. 18. As shown in FIG. 19, the active region AA is defined and surrounded by the isolation regions BB. The contact plugs 190 and the buried gate structures BG are alternately arranged along the first direction D1. In addition, the buried gate structures BG extend in the second direction D2 perpendicular to the first direction D1. In some embodiments, the contact plugs 190 extend in a third direction D3 that is perpendicular to both the first direction D1 and the second direction D2.

FIG. 20 is a schematic top view of the semiconductor device TS1 in FIG. 18. The gate terminal (not shown) in the buried gate structure BG is physically separated from and electrically isolated from the source terminal/drain terminal (not shown) in the active region AA by the gate liner 160. The buried gate structures BG may have a recess-type channel and serve as buried word lines in a DRAM device. In addition, the contact plugs 190 may function as preliminary bit lines electrically connected to the source terminal/drain terminal in the active region AA. In FIG. 20, the buried gate structure BG and the contact plug 190 intersect each other at right angles, wherein the buried gate structure BG extends in the second direction D2 and the contact plug 190 extends in the third direction D3 perpendicular to the second direction D2.

Figure 21:
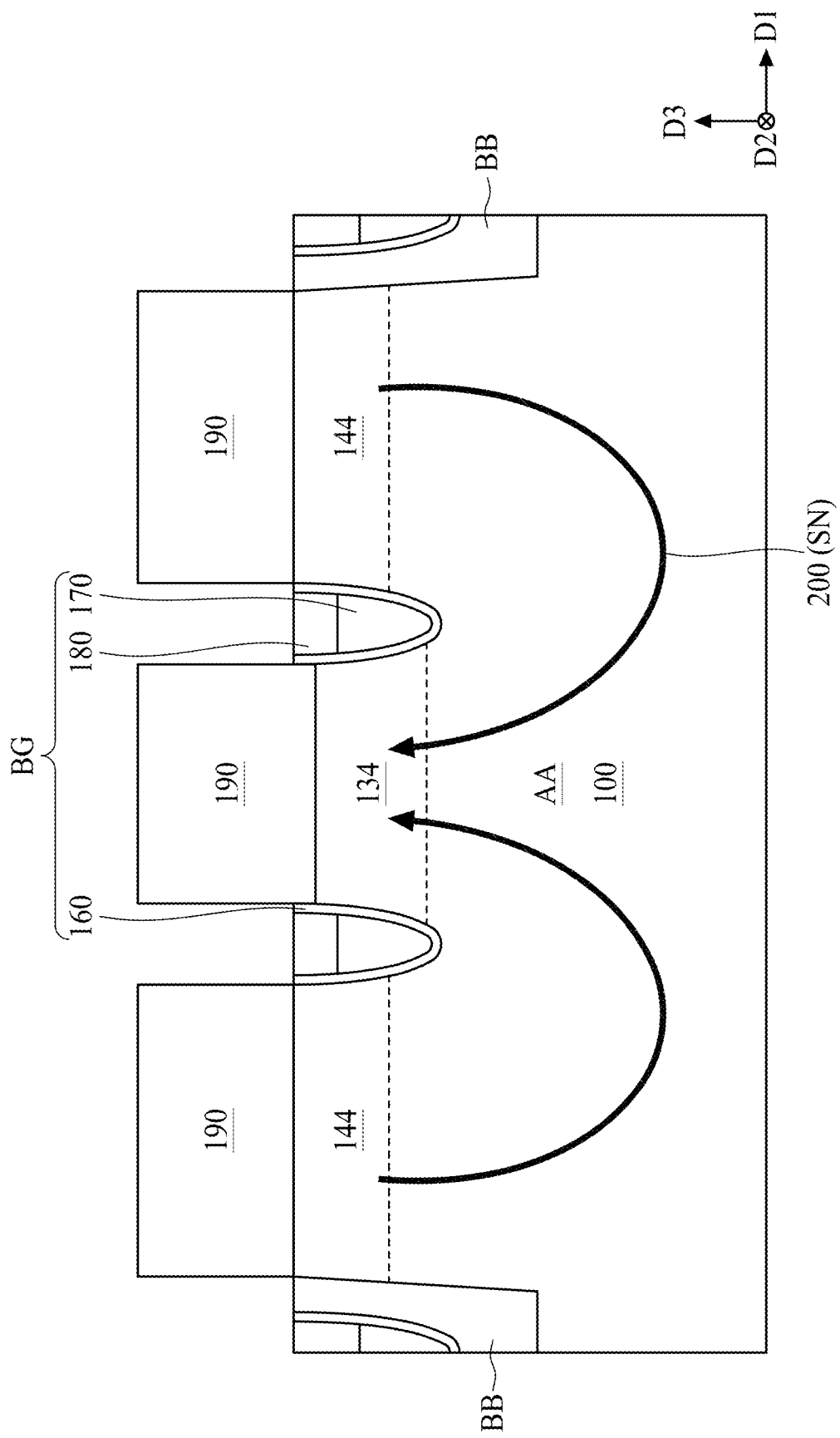
FIG. 21 is a schematic diagram illustrating an operation of the semiconductor device in FIG. 18, in accordance with some embodiments of the present disclosure.

FIG. 21 is a schematic diagram illustrating an operation principle of the semiconductor device TS1 in FIG. 18. In an embodiment of the present disclosure, the semiconductor device TS1 comprises buried-channel-array transistors (BCAT). Therefore, a U-shaped buried channel 200 between the p-type doped region 134 and the n-type doped region 144 may be formed in the active region AA. As a result, the effective channel length in the semiconductor device TS1 can be increased due to the existence of the buried gate structure BG, compared to a conventional planar MOS structure having a straight channel. The U-shaped buried channel 200 made possibly by the buried gate structure BG may be effective to, e.g., suppress a short channel effect within the substrate 100.

In addition, in the embodiment of the present disclosure, the BCAT-type semiconductor device TS1 includes a tunneling field-effect transistor (TFET). The semiconductor device TS1 may be operated according to a quantum tunneling mechanism. In some embodiments, the buried gate structure BG is an intrinsic region without any significant dopant. Therefore, there is a dopant gradient from the buried gate structure BG to the p-type doped region 134, and a dopant gradient from the buried gate structure BG to the n-type doped region 144. Because the P-I-N junction exists in the semiconductor TS1, when a sufficient gate voltage ($V_G$) is applied to the buried gate structure BG, a band-to-band tunneling (BTBT) will occur, causing electrons to tunnel from the p-type doped region 134 through the intrinsic buried gate structure BG to the n-type doped region 144. As a result, a storage current SN may flow through the buried channel 200 from the n-type doped region 144 to the p-type doped region 134 when the semiconductor device TS1 is in operation. In the embodiment of the present disclosure, the semiconductor device TS1 utilizes an operation mechanism different from that of a thermionic emission occurring in a conventional MOSFET, and therefore leakage current can be greatly reduced.

The present disclosure provides a semiconductor device comprising both the BCAT structure and the TFET structure. The BCAT structure of the semiconductor device increases the effective channel length formed therein. In addition, due to the quantum tunneling mechanism in the TFET structure, the subthreshold swing (SS) of the semiconductor device can be reduced and the performance of the semiconductor device can therefore be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method of fabricating a semiconductor device, comprising:
    providing a substrate comprising a first surface;
    forming a sacrificial oxide layer on the first surface;
    forming a plurality of isolation regions in the substrate to define an active region;
    implanting first dopants into the active region to form a first doped region;
    implanting second dopants into the active region to form a second doped region, wherein an interface exists between the first doped region and the second doped region;
    forming a buried gate structure between the first doped region and the second doped region, the formation of the buried gate structure comprising:
    forming a gate trench between the first doped region and the second doped region;
    forming a gate liner on a sidewall of the gate trench;
    forming a gate conductive material within the gate trench and surrounded by the gate liner; and
    forming a gate insulating layer on the gate conductive material; and
    forming a contact plug on the substrate to electrically connect the contact plug to the first doped region and the second doped region;
    wherein the formation of the gate trench comprises:
    forming a second patterned photoresist on the substrate, wherein the second patterned photoresist exposes surfaces of the plurality of isolation regions and a surface of the sacrificial oxide layer over the interface between the first doped region and the second doped region; and
    removing portions of the sacrificial oxide layer and the active region exposed through the second patterned photoresist to form the gate trench.

2. The method according to claim 1, wherein the formation of the plurality of isolation regions comprises:
    forming a first patterned photoresist to define locations of the plurality of isolation regions;
    removing the substrate and the sacrificial oxide layer exposed through the first patterned photoresist to form a plurality of isolation trenches; and
    filling each of the plurality of isolation trenches with an insulating material.

3. The method according to claim 1, wherein the implantation of the first dopants into the active region includes forming a first implant mask on the active region, the first implant mask including an opening which exposes a portion of the sacrificial oxide layer.

4. The method according to claim 1, wherein the implantation of the second dopants into the active region includes forming a second implant mask on the active region, the second implant mask covering the first doped region.

5. The method according to claim 1, wherein the implantation of the first dopants into the active region includes forming the first doped region with a first depth in the substrate.

6. The method according to claim 5, wherein the implantation of the second dopants into the active region includes forming the second doped region with a second depth in the substrate.

7. The method according to claim 6, wherein the first depth is substantially greater than the second depth.

8. The method according to claim 1, wherein the first doped region and the second doped region are substantially separated from each other by the buried gate structure.

9. The method according to claim 1, wherein the gate trench is located at the interface between the first doped region and the second doped region.

10. The method according to claim 1, wherein the formation of the gate conductive material comprises depositing the gate conductive material in a lower portion of the gate trench, wherein a top surface of the gate conductive material is lower than the first surface of the substrate.

11. The method according to claim 1, wherein the formation of the gate insulating layer comprises depositing the gate insulating layer in an upper portion of the gate trench.

12. A method of fabricating a semiconductor device, comprising:
    providing a substrate comprising a first surface;
    forming a sacrificial oxide layer on the first surface;
    forming a plurality of isolation regions in the substrate to define an active region;
    implanting first dopants into the active region to form a first doped region;

implanting second dopants into the active region to form a second doped region, wherein an interface exists between the first doped region and the second doped region;

forming a buried gate structure between the first doped region and the second doped region, the formation of the buried gate structure comprising:

forming a gate trench between the first doped region and the second doped region;

forming a gate liner on a sidewall of the gate trench;

forming a gate conductive material within the gate trench and surrounded by the gate liner; and forming a gate insulating layer on the gate conductive material; and forming a contact plug on the substrate to electrically connect the contact plug to the first doped region and the second doped region;

wherein after the formation of the gate insulating layer, a planarization process is performed to remove at least a portion of the sacrificial oxide layer to expose the first surface of the substrate, wherein the first doped region and the second doped region are exposed through the first surface.

13. The method according to claim 1, wherein the formation of the contact plug comprises embedding a portion of the contact plug in the second doped region.

14. The method according to claim 1, wherein the first doped region and the second doped region are at two opposite sides of the buried gate structure.

15. The method according to claim 1, wherein the buried gate structure extends along the first surface of the substrate.

16. The method according to claim 15, wherein the contact plug extends along a direction substantially perpendicular to the first surface of the substrate.

* * * * *